(12) United States Patent
Gerginov

(10) Patent No.: US 10,965,298 B2
(45) Date of Patent: Mar. 30, 2021

(54) TWO-PHOTON OPTICAL FREQUENCY REFERENCE WITH ACTIVE AC STARK SHIFT CANCELLATION

(71) Applicant: The Regents of the University of Colorado, a body corporate, Denver, CO (US)

(72) Inventor: Vladislav Gerginov, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 16/790,276

(22) Filed: Feb. 13, 2020

(65) Prior Publication Data
US 2020/0259498 A1  Aug. 13, 2020

Related U.S. Application Data

(60) Provisional application No. 62/805,264, filed on Feb. 13, 2019.

(51) Int. Cl.
*H03L 7/26* (2006.01)
*H03B 17/00* (2006.01)
*G04F 5/14* (2006.01)

(52) U.S. Cl.
CPC .......... *H03L 7/26* (2013.01); *G04F 5/14* (2013.01); *H03B 17/00* (2013.01)

(58) Field of Classification Search
CPC ........ G02F 1/3501; G02F 1/3532; G02F 1/37; G04F 5/14; G04F 5/145; H01S 3/0057;
(Continued)

(56) References Cited

U.S. PATENT DOCUMENTS 8,780,948 B2    7/2014  Wilkinson et al.
8,873,061 B1 *  10/2014 Wells .................... G01N 21/39
                                                      356/437
(Continued)

OTHER PUBLICATIONS

Gerginov, V. et al., "Two-Photon Optical Frequency Reference With Active AC Stark Shift Cancellation," Physical Review Applied, vol. 10, pp. 014031-1-014031-8, Jul. 30, 2018.
(Continued)

*Primary Examiner* — Levi Gannon

(57) ABSTRACT

In some embodiments, two light beams having different frequencies can be counter-propagated through an atomic absorber having an atomic transition frequency approximately equal to the sum of the frequencies of the two beams. When the beams are appropriately tuned, the atomic absorber absorbs significant amount of light of at least the lower power beam. The amount of light remaining after the absorber is an indication of how well the frequencies are tuned to the absorber. At least one of the beam frequencies has an FM modulation applied prior to the absorber. This means the phase of the remaining light compared to the FM modulation, along with the intensity of the remaining light, can be used to provide a first feedback signal to adjust the frequencies of the beams to match the absorber frequency. Finally, both beams have amplitude modulation applied before the absorber. Comparing the response of the first feedback signal to the AM modulation frequency generates an intensity ratio feedback signal used to adjust the power of at least one of the beams and realize the zero light shift condition.

22 Claims, 13 Drawing Sheets

(58) Field of Classification Search
CPC ........ H01S 3/0092; H01S 3/13; H01S 3/1303; H01S 3/1305; H01S 3/1306; H01S 3/1392; H01S 3/23; H01S 3/2383; H01S 3/2391; H03B 17/00; H03L 7/26
See application file for complete search history.

(56) References Cited

U.S. PATENT DOCUMENTS

| | | | |
|---|---|---|---|
| 9,905,999 B2* | 2/2018 | Li | H01S 3/0085 |
| 10,353,270 B2 | 7/2019 | Perrella et al. | |
| 2015/0236784 A1* | 8/2015 | Vahala | H04B 10/503 |
| | | | 398/115 |

OTHER PUBLICATIONS

Martin, Kyle W. et al., "Compact Optical Atomic Clock Based On A Two-Photon Transition In Rubidium," Physical Review Applied, vol. 9, pp. 014019-1-014019-10, Jan. 18, 2018.
Martin, Kyle W. et al., "Frequency Shifts Due to Stark Effects On A Rubidium Two-Photon Transition," Physical Review A, vol. 100, pp. 023417-1-023417-11, Aug. 28, 2019.
Perrella, C. et al., "Two-Color Rubidium Fiber Frequency Standard," Optics Letters, vol. 38, No. 12, pp. 2122-2124, Jun. 15, 2013.
Shirley, Jon H., "Modulation Transfer Processes In Optical Heterodyne Saturation Spectroscopy," Optics Letters, vol. 7, No. 11, pp. 537-539, Nov. 1982.
Telle, H. R. et al., "Kerr-Lens, Mode-Locked Lasers As Transfer Oscillators For Optical Frequency Measurements," Applied Physics B, vol. 74, 6 pages, 2002.

\* cited by examiner

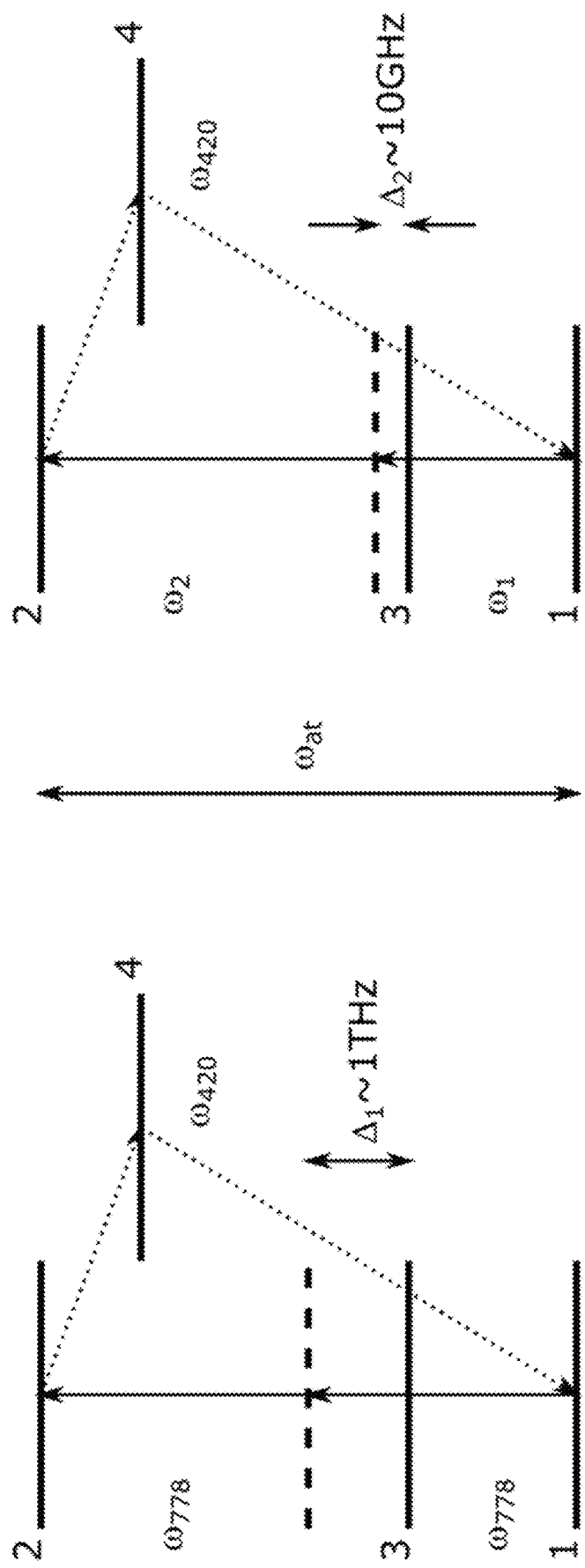

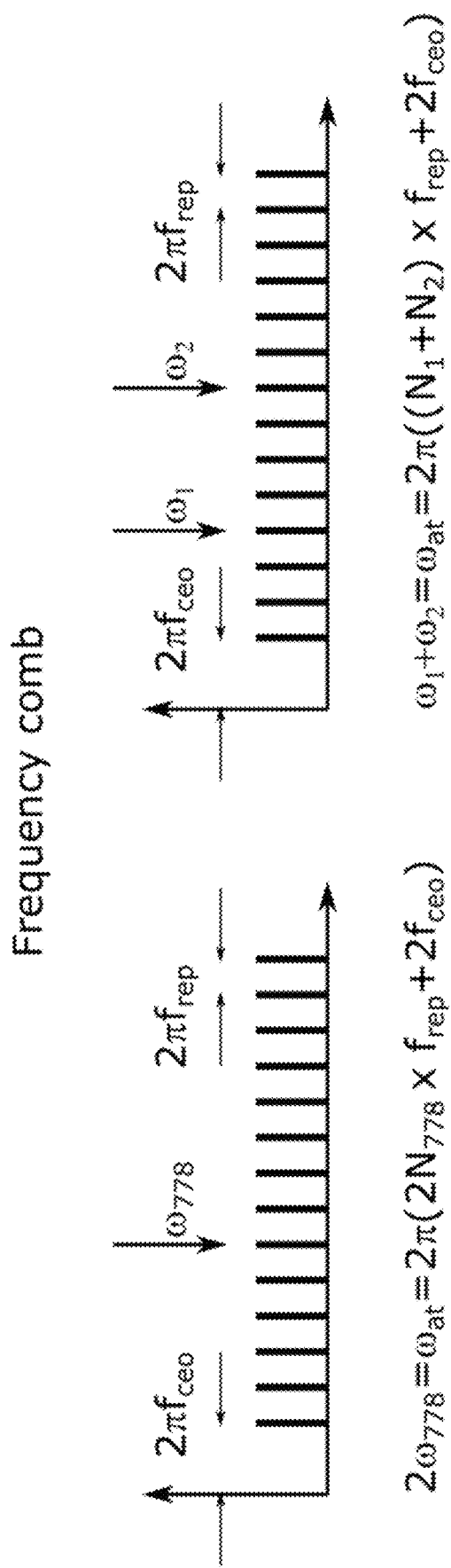

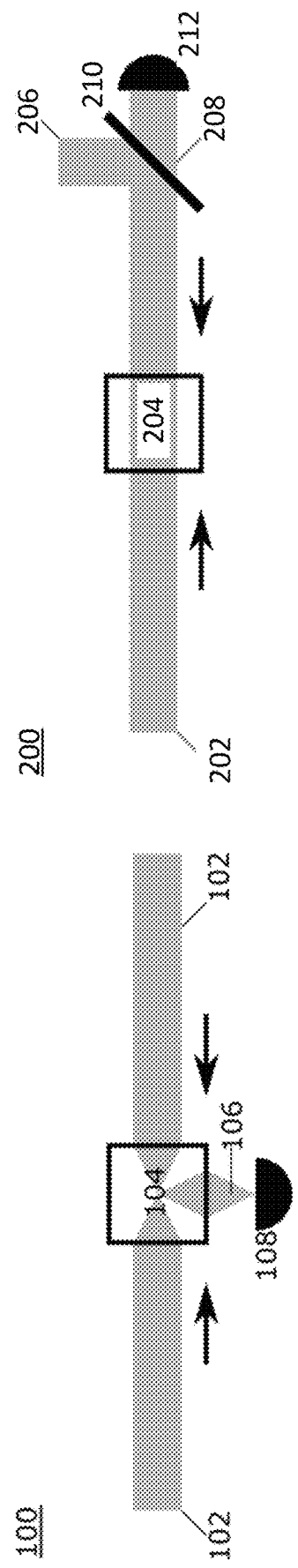

TWO-PHOTON OPTICAL FREQUENCY REFERENCE WITH ACTIVE AC STARK SHIFT CANCELLATION

CROSS-REFERENCE TO RELATED APPLICATIONS

This application claims priority to U.S. Provisional Application Ser. No. 62/805,264 filed Feb. 13, 2019, which is incorporated herein by reference in its entirety for all purposes.

STATEMENT REGARDING FEDERALLY SPONSORED RESEARCH

This invention was made with government support under grant number 70NANB14H095 awarded by NIST. The government has certain rights in the invention.

TECHNICAL FIELD

Various embodiments of the present technology generally relate to optical frequency references. More specifically, some embodiments of the present technology relate to a two-photon optical frequency reference with active AC stark shift cancellation.

BACKGROUND

Atomic frequency references can fall into two general categories—microwave frequency references and optical frequency references. Optical frequency references have higher clock frequencies than microwave references. This higher clock frequency gives optical frequency references a higher accuracy than microwave frequency references. For many commercial applications, there is often a desire to have simple configurations. Rubidium-based clocks are good candidates for practical reasons. First, there is an existing robust technology for existing lasers. For example, the lasers that are used to excite the atoms are used in other areas (e.g., the telecom domain). Second, the technology is fairly simple and provides performance sufficient for many applications.

In order to stabilize an oscillator to the atomic transition, and realize the clock, the systems need to probe the atomic transition with a probe light. However, the moment the atoms are exposed to the probe light, the light itself changes the transition frequency due to the AC Stark shift, or light shift, effect. Depending on the intensity of the light, different transition frequencies can occur (e.g., higher the intensity, the higher the transition frequency). This is bad for a frequency reference as it is dependent on the probe light intensity. As such, the probe light intensity needs to be highly controlled making the clock more complicated.

Various traditional systems can use the laser and simultaneously detect the laser power with a photodiode to stabilize the laser power in hopes this translates to a stable laser intensity where the atoms are located. However, stable power in one location does not necessarily mean stable intensity in another. In addition, the photodetector is external, so it is not necessarily that the atoms are exposed to the same light intensity as the photodetector.

SUMMARY

Systems and methods are described for a two-photon optical frequency reference with active AC stark shift cancellation. Some embodiments provide systems and methods for realizing a more stable two-photon optical frequency reference. This can be accomplished using two light beams of photons at two different optical frequencies to perform a two-photon spectroscopy which allows for AC Stark shift cancellation. The sum of the two optical frequencies can be stabilized to the atomic absorber transition frequency using a sum frequency feedback (error) signal. An intensity ratio between the beams interacting within the absorber can be chosen such that it cancels the AC Stark shift.

In accordance with some embodiments, a common amplitude (AM) modulation can be applied to both beam powers (and correspondingly, intensities) before the beams interact with the absorber. Depending on the intensity ratio of the beams interacting with the atoms, the sum frequency feedback signal (used to stabilize the sum of the light frequencies to the two-photon atomic absorber transition frequency) exhibits a modulation due to the common AM intensity modulation. The resulting modulation's phase and amplitude depend on the deviation of the intensity ratio from the one which cancels the AC Stark shift. Thus, the atoms' response to light's common mode intensity modulation provides information about the deviation of the light intensity ratio from the value which cancels the AC Stark shift. In certain atoms, a physical (positive) intensity ratio exists that cancels the AC Stark shift, and in this case this information can be used for atom-based AC Stark shift cancellation as described below.

In some embodiments, two light beams having different optical frequencies can be propagated through an atomic absorber which has an atomic transition with a frequency equal to (or approximately equal to) the sum of the frequencies of the two beams. "Approximately equal to" means that some of the light is absorbed. Thus, the sum of the frequencies can be made equal to the frequency of the transition by slightly adjusting the frequency of the first or second beam.

Both beams preferably have the same spatial profile applied before entering the atomic absorber. When the light beam frequencies are appropriately tuned, the atomic absorber absorbs some of the light from each beam. The amount of light remaining after the absorber is an indication of how well the sum of the beam frequencies is tuned to the atomic absorber transition frequency. In addition, at least one of the beam frequencies has a frequency (FM) modulation applied prior to the atomic absorber. The remaining light after the absorber exhibits in general a modulation caused by this FM modulation. Comparing the remaining light modulation to the original FM modulation can be used to generate a sum frequency feedback (error) signal, which is used to adjust the sum of the light beam frequencies to match the atomic absorber transition frequency.

In general, once the sum of the beam frequencies is stabilized to the atomic absorber transition frequency, one of the beam frequencies can be stabilized to the frequency of a corresponding component of a self-referenced frequency comb. The other beam frequency can then be used to stabilize the repetition rate of the comb, realizing an optical frequency reference.

In a second implementation, each beam frequency is stabilized to the frequency of a corresponding component of a self-referenced frequency comb, so that the repetition rate of the comb is the adjusted parameter, allowing the sum of the light beam frequencies to match and to be stabilized to the atomic absorber transition frequency, realizing an optical frequency reference.

In a third implementation, each beam frequency is compared with the frequency of a corresponding component of a self-referenced frequency comb. The resulting two frequency differences can be used to stabilize the repetition rate of the comb to the atomic absorber transition frequency using the frequency transfer method, as in Telle et al., Appl. Phys. B 74, 1-6, 2002. An output frequency is derived from the stabilized comb repetition rate, realizing an optical frequency reference.

The sum frequency feedback signal exhibits a modulation through the AC Stark shift (light shift) of the atomic transition frequency that is caused by the AM modulation applied to the light beams before the absorber. A comparison of the sum frequency feedback signal modulation to the original AM modulation can be used to generate an intensity ratio feedback (error) signal, which adjusts the power of at least one of the beams before the absorber. This is useful if the intensity of one or both beams inside the absorber drifts, as using the intensity ratio feedback brings the intensity ratio back to optimal value (corresponding to a zero light shift value) determined by the atomic absorber's response.

For example, in some embodiments, two light beams at frequencies $\omega_1$ (e.g., a wavelength of 780 nm) and $\omega_2$ (e.g., a wavelength 776 nm) can excite the rubidium two-photon transition when the sum of $\omega_1$ and $\omega_2$ optical frequencies matches the atomic transition two-photon frequency $\omega_{at}$. The light beam frequency $\omega_1$ is blue- (or red-) detuned (frequency detuning) from the 5s $^2S_{1/2} \rightarrow$ 5p $^2P_{3/2}$ transition at 780 nm, and the light beam frequency $\omega_2$ is correspondingly red- (or blue-) detuned by $\Delta$ from the 5p $^2P_{3/2} \rightarrow$ 5d$^2D_{5/2}$ rubidium-87 transition at 776 nm. The two beams at $\omega_1$ and $\omega_2$ optical frequencies can be spatially separated or overlapped by splitter/combiners. To stabilize the sum of the two beam frequencies to the absorber transition frequency $\omega_{at}$, the beams are spatially separated and counter-propagated through the absorber and a splitter/combiner allows the detection of the light at frequency $\omega_1$ (wavelength 780 nm) without contribution from the light at frequency $\omega_2$ (wavelength 776 nm).

In one of the optical frequency reference implementations, the difference between the two light frequencies is controlled by the frequency comb (by stabilizing each light frequency to a corresponding comb component), while the sum of the light frequencies is stabilized to the atomic absorber transition frequency $\omega_{at}$. Thus, the single degree of freedom of the self-referenced frequency comb (its repetition rate $f_{rep}$) is referenced to the atomic transition frequency $\omega_{at}$ by the relation $$\omega_{at} = \omega_1 + \omega_2 = (N_1 + N_2) \times 2\pi f_{rep} + 2\pi f_{CEO},$$

where $N_1$ and $N_2$ are the two frequency comb components to which the two light frequencies are stabilized, and $f_{ceo}$ is the carrier-envelope offset frequency of the comb fixed by the self-referencing mechanism. Referencing the repetition rate $f_{rep}$ to the atomic absorber transition frequency $\omega_{at}$ realizes the optical frequency reference, with the device's output frequency derived from the stabilized repetition rate $f_{rep}$.

While multiple embodiments are disclosed, still other embodiments of the present technology will become apparent to those skilled in the art from the following detailed description, which shows and describes illustrative embodiments of the technology. As will be realized, the technology is capable of modifications in various aspects, all without departing from the scope of the present technology. Accordingly, the drawings and detailed description are to be regarded as illustrative in nature and not restrictive.

BRIEF DESCRIPTION OF THE DRAWINGS

Embodiments of the present technology will be described and explained through the use of the accompanying drawings.

FIG. 1A is a simplified energy diagram of a conventional two-photon rubidium optical frequency reference device.

FIG. 1B is a diagram showing the stabilization of the $f_{rep}$ of the device of FIG. 1A to the atomic absorber transition frequency $\omega_{at}$.

FIG. 1C is a block diagram of the spectroscopy portion of the device of FIG. 1A.

FIG. 2A is a simplified energy diagram of a two-photon rubidium optical frequency reference device according to the present invention.

FIG. 2B is a diagram showing the stabilization of the $f_{rep}$ of the device of FIG. 2A to the atomic absorber transition frequency $\omega_{at}$.

FIG. 2C is a block diagram of the spectroscopy portion of the device of FIG. 2A.

Figure 3A:
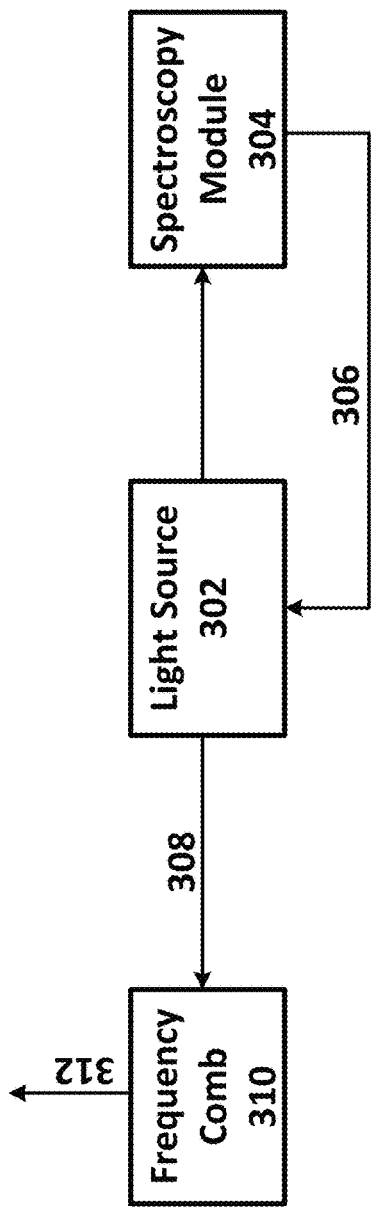
FIG. 3A is a schematic block diagram illustrating the stabilization process of the conventional device of FIGS. 1A-1C.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

Various embodiments of the present technology generally relate to optical frequency references. More specifically, some embodiments of the present technology relate to a two-photon optical frequency reference with active AC stark shift cancellation. The rubidium two-photon $5s^2 S_{1/2} \to 5d^2 D_{5/2}$ optical transition at 778 nm has been recommended as a secondary representation of the second and has been investigated as an optical frequency reference. The reference is of particular interest because of the relative simplicity of the setup, high atomic Q factor, and the possibility of using telecommunication components at 1560 nm for both excitation and frequency division down to the microwave domain by optical frequency combs. The largest source of systematic frequency shift of the transition is the ac Stark shift (light shift), which also leads to frequency instability through changes in the interrogating laser intensity experienced by the atoms. The short-term stability of existing two-photon rubidium references has been limited to above $10^{-13}/\sqrt{\tau}$ (with $\tau$ the integration time in seconds) due to the low detection efficiency of the employed fluorescence detection of the transition. Also, intensity and atomic temperature instability put upper limits on the interrogating laser intensity and atomic vapor density in order to reach the required long-term performance of the reference, thus limiting the practical short-term stability to above $10^{-13}/\sqrt{\tau}$.

In contrast to the traditional single-frequency (or single-color) interrogation, the two-photon transitions can also be driven by photons at two different optical frequencies (or two-color case) that are tuned closer to a dipole-allowed transition. The clear advantage is the many orders of magnitude enhancement of the transition rate, at the expense of some transition broadening due to the residual Doppler shift. The technique has been used for sum frequency stabilization, and in an absolute frequency reference via a self-referenced frequency comb (C. Perella et al., Phys. Rev. Appl. 12, 054063, 2019 which is hereby incorporated by reference in its entirety for all purposes)]. The enhancement in transition rate is accompanied with increased ac Stark shift due to the stronger dipole-allowed transition coupling.

The additional degrees of freedom offered by two-color excitation can minimize this systematic effect. First, as shown below, for a fixed transition rate the ac Stark shift is reduced. Second, as has been pointed out, the use of two different frequencies allows two-photon spectroscopy with zero differential ac Stark shift. The concept is similar to the magic wavelength in optical lattice clocks. By selecting an appropriate frequency detuning of the two optical fields from the intermediate atomic state(s) that is (are) coupled by allowed dipole transitions to the two-photon clock states, as well as the intensity ratios of the two optical fields, the differential ac Stark shift of the clock states can be zeroed.

Various embodiments of the present technology have successfully demonstrated that the ac Stark shift of the $5s^2 S_{1/2} \to 5d^2 D_{5/2}$ two-photon Rb optical reference can be actively canceled by the use of two-color spectroscopy. The detection of the atomic transition via light absorption is more efficient because the transition branching ratios do not play a role in contrast to conventional fluorescence detection, the efficiency of a Si photodetector is higher than that of a photomultiplier, and the reduced detuning from the intermediate state allows the laser beam waist (and correspondingly active interaction volume) to be increased to achieve the same transition rate as in the single-color case. As such, various embodiments provide both improved short- and long-term performance of the optical frequency reference.

With two light fields used in various embodiments, implementation of the frequency counting with a frequency comb can be a little more complicated. One way is to measure the two probe light field frequencies with the frequency comb. Then using mathematics and some control system, the repetition rate can be stabilized. A second way is to stabilize the frequency of one of the light fields to the frequency of a comb component, and use a feedback for the comb's repetition rate to stabilize the frequency of another comb component to that of the second field using traditional techniques. Both the first and the second ways assume the sum of the light field frequencies has been stabilized to the atomic resonance. A third way is to stabilize both light fields to the comb and control their frequency sum by changing the repetition rate. Stabilizing the sum frequency to the atomic resonance frequency is performed by controlling the repetition rate and, as a result, the repetition rate is stabilized to the atomic transition frequency. The frequency comb's repetition rate, stabilized to the atomic resonance frequency, can be used to generate a stable frequency output of the device, realizing an optical frequency reference.

Various embodiments of the present technology provide for a wide range of technical effects, advantages, and/or improvements to computing systems and components. For example, various embodiments include one or more of the following technical effects, advantages, and/or improvements: 1) the use of two light fields to excite the atomic transition allows to control and zero the light shift by adjusting the light intensity ratio, with the result that the optical frequency reference is more stable and has reduced frequency offset from the unperturbed atomic transition; 2) changing the manner of atomic transition detection by the use of light absorption measurement allows to improve the detection signal-to-noise and thus to increase the frequency stability of the optical frequency reference; 3) the use of two light fields to excite the atomic transition allows to use the method of modulation transfer spectroscopy, in which one of the light fields is modulated, and the modulation affects the detected absorption of the second light field; 4) the amount of transmitted light used for detection allows to use conventional photodiodes compared to photomultipliers used in fluorescence detection that have higher environmental sensitivity, with the result that the frequency feedback that stabilizes the sum light field frequencies has a larger bandwidth and improved stability; and/or 5) the frequencies of the two light fields are closer to an off-resonant atomic state, which increases the transition probability and allows to use collimated light fields compared to the focused ones in the conventional single-color case.

In the following description, for the purposes of explanation, numerous specific details are set forth in order to provide a thorough understanding of embodiments of the present technology. It will be apparent, however, to one skilled in the art that embodiments of the present technology may be practiced without some of these specific details. The techniques introduced here can be embodied as special-purpose hardware (e.g., circuitry), as programmable circuitry appropriately programmed with software and/or firmware, or as a combination of special-purpose and programmable circuitry. Hence, embodiments may include a machine-readable medium having stored thereon instructions which may be used to program a computer (or other electronic devices) to perform a process. The machine-readable medium may include, but is not limited to, floppy diskettes, optical disks, compact disc read-only memories (CD-ROMs), magneto-optical disks, ROMs, random access memories (RAMs), erasable programmable read-only memories (EPROMs), electrically erasable programmable read-only memories (EEPROMs), magnetic or optical cards, flash memory, or other type of media/machine-readable medium suitable for storing electronic instructions.

The phrases "in some embodiments," "according to some embodiments," "in the embodiments shown," "in other embodiments," and the like generally mean the particular feature, structure, or characteristic following the phrase is included in at least one implementation of the present technology, and may be included in more than one implementation. In addition, such phrases do not necessarily refer to the same embodiments or different embodiments.

General Description

In various embodiments of the present technology, two light fields having two different frequencies are used to control light shift. The two different light fields provide an increased level of control of the light shift over traditional systems using a single light by introducing additional parameters that can be adjusted. Some embodiments control the relative intensity of the light fields with respect to each other allowing the light shift to be zeroed (i.e., the atomic transition frequency is not impacted by the presence of the probe light fields). In addition, this information can be extracted by the spectroscopy of the atoms themselves, and is not provided by light detection at a spatially different position. As such, the signal that is derived from the atoms, after the light interacts with the atoms, is detected on the light after the light has passed through the atomic absorber. Therefore, various embodiments are not relying on external detection of the light independent of the atoms to stabilize the intensity ratio, but the atoms "measure" and provide feedback on how to correct the intensity ratio of the light fields.

Since various embodiments use two light fields (e.g., a stronger one and a weaker one), the effect the atoms have on the light can be detected from the absorption of the weak beam caused instead of the fluoresces from the atoms (which is difficult, inefficient to measure, has reduced bandwidth, and is done with photomultipliers that exhibit higher environmental sensitivities than photodiodes). This gives an improved stability of the reference. As such, the noise of the system can be reduced by detecting the weak beam, and the long term drift can be reduced by controlling the light shift caused by the light with intensity ratio feedback.

In order to have a useful optical reference, one needs to be able to count the number of cycles of the light. Various embodiments use a frequency comb. For traditional systems with a single probe light frequency, one way of using the frequency comb is to use the comb to measure the frequency of the probe light field. Similarly, some traditional system stabilize the comb to the light field by controlling the comb's repetition rate, thereby transferring the stability of the atomic resonance to the repetition rate of the comb.

FIG. 1A is a simplified energy diagram of a conventional two-photon rubidium optical frequency reference device. FIG. 1B is a diagram showing the stabilization of the $f_{rep}$ of the device of FIG. 1A to the atomic absorber transition frequency $\omega_{at}$. More specifically, FIG. 1A is a simplified energy diagram of a conventional two-photon rubidium optical reference using two photons having the same wavelength (778 nm) to stimulate the rubidium in a vapor cell in a counter-propagating geometry as shown in FIG. 1C. Fluorescence is measured at the detector and the value used as feedback for frequency stabilization (see FIG. 3A).

FIG. 1B illustrates the two-photon transition stabilization in a traditional system. As illustrated in FIG. 1B, the light (e.g., laser) frequency is stabilized to the atomic transition, and its frequency 778 nm is used to reference the repetition rate $f_{rep}$ of a self-referenced optical frequency comb. Note that the comb of FIG. 1B is locked to the optical transition for stabilization of the comb's repetition rate ($f_{rep}$). U.S. Pat. No. 8,780,948 (incorporated herein by reference in its entirety for all purposes) describes an example of a traditional system currently based on this technique. FIG. 1C is a block diagram of the spectroscopy portion 100 creating the simplified energy diagram shown in FIG. 1A. As illustrated in FIG. 1C, a light source generates light signal 102 at a frequency (e.g., 778 nm) which illuminates atomic absorber 104. A two-photon fluorescence 106 is stimulated at a second frequency (e.g., 420 nm) and measured by detector 108.

FIG. 2A is a simplified energy diagram of a two-photon rubidium optical frequency reference device according to various embodiments the present technology. As illustrated in FIG. 2A, the optical frequency reference can have two light beams having frequencies $\omega_1$ and $\omega_2$. FIG. 2B is a diagram showing the stabilization of the $f_{rep}$ of the device of FIG. 2A to the atomic absorber transition frequency $\omega_{at}$. U.S. Pat. No. 10,353,270 (incorporated herein by reference in its entirety for all purposes) describes an example of a system currently based on this technique. FIG. 2C is a block diagram of the spectroscopy portion 200 of the device producing the simplified energy diagram of FIG. 2A. As illustrated in FIG. 2C, an incident light 202 with a first frequency ($\omega_1$) illuminates atomic absorber 204. The transmitted light 208 passes through a splitter/combiner 210 and is detected by a detector 212. A second incident light 206 with a second frequency ($\omega_2$) illuminates the splitter/combiner 210 and is redirected to the absorber 204. Detector 212 measures absorption instead of fluorescence (as in the traditional system shown in FIG. 1C), which improves the detection efficiency.

In this device, the frequency comb of FIG. 2B is stabilized to the optical transition for stabilization of $f_{rep}$ to $\omega_{at}$ using two light sources at different optical frequencies. The equation satisfied is:

$$\omega_1 + \omega_2 = \omega_{at} = 2\pi((N_1 + N_2) \times f_{rep} + 2f_{ceo}).$$

The intensity ratio of the two light beams at the position of the atoms is used as an adjustable parameter to cancel the light shift. The atoms provide information for the deviation of the actual ratio value from the "zero light shift" intensity ratio value (atom-based light shift cancellation). In this example, $\omega_1$ corresponds to 780 nm and $\omega_2$ to 776 nm wavelength.

With two light fields used in various embodiments, implementation of the frequency counting with a frequency comb can be a little more complicated. In some embodiments, an optical atomic frequency reference features an atomic absorber, and an oscillator (the probing light). The frequency (oscillation) of the probe light is adjusted to coincide with the frequency of a transition in the atomic absorber by a frequency feedback signal. In some embodiments of the two-color frequency references, the atomic transition is probed by two light photons. In other embodiments, the photons can be of the same frequency (color), or at two different frequencies (colors). In the same-color case, twice the light frequency is made equal to the atomic transition frequency by the frequency feedback. In the two-color case, the sum of the two frequencies is made equal to the atomic transition frequency by a (sum) frequency feedback. The probe light influences the atomic transition frequency, which needs to instability in the optical frequency reference (AC Stark, or light, shift).

It is often the largest cause for frequency instabilities in optical atomic frequency references. The atomic transition frequency shift depends on the probe light intensity. The reason for the light shift is the presence of additional atomic transitions (apart from the reference transition ones) that are coupled to the probe light.

The use of different frequencies allows the use of additional parameters—the values of the frequencies (only their sum is equal to the atomic transition frequency, their difference can change), and the intensity ratio of the two light fields. Various embodiments can use (87Rb) for controlling the two individual frequencies and the intensity ratio, the light shift can be made zero. Information can be extracted about the light shift from the atom-light interaction (intensity ratio feedback) that can be used to adjust the intensity ratio to the zero light shift value by reading out the atomic response. This is fundamentally different to stabilizing light intensities through light power measurement with a detector spatially separated from the atomic absorber. Various embodiments of the method use intensity modulation of both probe light fields, and demodulation of the corresponding response of the sum frequency feedback. The best results seem to be when the relative depth of intensity modulation is the same for both probe light fields.

The use of two probe light frequencies allows to detect light-atom interaction in relative absorption mode, by measuring the light absorption of the weaker light field. In the same-color case, the relative absorption is very low and the presence of light noise makes it difficult to achieve high signal to noise, so fluorescence detection is used. In the two-color case, one of the light fields is much weaker and its relative absorption is higher, allowing higher signal to noise. The use of two light frequencies and absorption detection also allows to use the modulation transfer method, which provides the best results in terms of sources of systematic frequency shifts. And the freedom to adjust the difference of the two probe light frequencies, the signal to noise can be increased for increased performance at short times, or the atomic ensemble density can be decreased for increased performance at long times.

The three disadvantages of the two-color method are the need of two spectrally different light fields instead of one, the residual Doppler broadening in thermal atomic vapors, and that the individual probe optical frequencies are not stabilized, only their sum is. The second disadvantage broadens the atomic resonance by a factor ~2 in 87Rb, which is acceptable. For cold atomic ensembles, the residual Doppler broadening is significantly suppressed. The stabilization of the individual frequencies can be done using the frequency comb, which is a necessary part of any optical frequency reference, and is not a significant challenge.

A frequency comb is a device that allows to down-convert an optical frequency to the microwave frequency domain, and is required for practical realization of any optical atomic frequency reference. The optical frequency comb consists of discrete optical spectral components, separated by the comb's repetition rate, with frequencies governed by the equation $f_n = f_{CEO} + N \cdot f_{rep}$, where $f_{CEO}$ is a constant frequency offset (carrier-envelope offset frequency), N is an integer number corresponding to the n-th comb component, and $f_{rep}$ is the repetition rate of the frequency comb.

In a self-referenced frequency comb, $f_{CEO}$ is measured and is related to $f_{rep}$, so that the comb's repetition rate $f_{rep}$ and N are the only parameters determines the optical frequency of each comb's component.

Typically, for a single-color case, the frequency of a frequency comb component is stabilized to the frequency of the probe light, in turn stabilized to the atomic transition. This is accomplished by measuring the difference between the two light fields on a photodetector, and generating a feedback to control the comb's repetition rate. When the frequency of the probe light is stabilized to the atomic transition, and the comb's repetition rate is stabilized to the probe light frequency, the repetition rate can be used to synthesize a frequency output and realize an optical atomic frequency reference.

There are three methods to stabilize the repetition rate of a frequency comb in the two-color case. They are not new, and are listed only to discuss the practical implementation of the two-color optical frequency reference. The first is the frequency transfer method. The sum of the probe light frequencies is stabilized to the atomic resonance. The differences of the two probe light frequencies against corresponding comb components are measured simultaneously, and a feedback signal for the repetition rate is generated. In this case only the sum of the probe light frequencies is stable, they can individually drift or one can be additionally stabilized. The second method is to lock one of the probe light frequencies to a comb component, and the sum of the probe light frequencies to the atomic absorber. In this case, the difference between the second probe light frequency and a corresponding comb component can be measured and used to generate a feedback signal to stabilize the comb's repetition rate.

The third method is to stabilize both individual probe light frequencies to corresponding comb components. Once stabilized, the sum of the two probe light frequencies is determined by the repetition rate of the comb. The repetition rate of the comb can then be stabilized to the atomic resonance directly by using the sum frequency feedback.

Figure 3B:
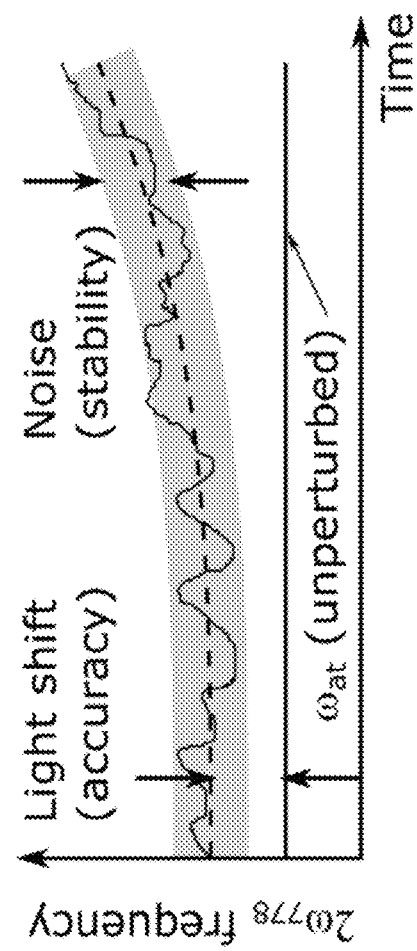
FIG. 3B is a plot illustrating the output frequency noise, and the frequency offset/drift (due to AC Stark shift of $\omega_{at}$ caused by the presence of light) of the output frequency of the device of FIG. 3A.

FIG. 3A illustrates an example of a frequency stabilization process of the conventional device of FIGS. 1A-1C. This process keeps noise within a band as shown in FIG. 3B, but there is an inherent light shift offset (a frequency shift due to the AC Stark shift effect) caused by the illumination process and (worse) this offset drifts over time with laser power drift which is hard to compensate for. As illustrated in FIG. 3A, light source 302 having of frequency $\omega_{778}$ sends a light beam to the atomic absorber (not shown in FIG. 3A). Light source 302 also sends a light beam 308 to frequency comb 310. The induced absorber fluorescence is detected by spectroscopy module 304 and can be used to generate a light frequency feedback signal 306 that stabilizes the frequency $\omega_{778}$ to the absorber's transition frequency $\omega_{at}$ ($2\omega_{778} = \omega_{at}$).

FIG. 3B is a plot illustrating noise and offset drift of the optical frequency $\omega_{778}$ (stabilized to $\omega_{at}$) of the device of FIG. 3A. Due to the low efficiency of the fluorescence detection, there is significant frequency noise of the device's stabilized optical frequency $\omega_{778}$, and correspondingly of the device's output frequency. Due to the power/intensity drift of the light, the atomic resonance frequency $\omega_{at}$ (and the device's output frequency 312 stabilized to $\omega_{at}$ through the comb's repetition rate $f_{rep}$) also drifts from the unperturbed value of $\omega_{at}$ due to the AC Stark shift (light shift) caused by the light.

Transition Rate and AC Stark Shift

For the present section, the participating states are labeled as $|g\rangle \equiv |5s^2 S_{1/2}\rangle$, $|e\rangle \equiv |5d^2 D_{5/2}\rangle$, $|k\rangle \equiv |5p^2 P_{3/2}\rangle$, and $|l\rangle \equiv |5p^2 P_{1/2}\rangle$. Letting $|i\rangle$ and $|j\rangle$ be generic, and the transition frequencies are introduced as $\omega_{ij} \equiv (E_i - E_j)/\hbar$ and $D_{ij} \equiv \langle i\|D\|j\rangle$, where $E_i$ is the energy state $|i\rangle$, $\hbar$ is the reduced Plank constant, and D is the electric dipole operator. The reduced matrix elements $D_{ij}$ are taken as real. The frequencies $\omega_{ij}$ are given in references, while theoretical values for the $D_{ij}$ are given in references.

The clock transition $|g\rangle \rightarrow |e\rangle$ is driven by two counter-propagating laser beams with lin⊥lin in polarization. The laser beams have frequencies $\omega_1$ and $\omega_2$, with respective intensities $I_1$ and $I_2$ at the atoms. The frequencies $\omega_1$ and $\omega_2$ are well detuned from electric dipole transition frequencies $\omega_{kg}$, $\omega_{lg}$, and $\omega_{ek}$ relative to natural linewidths and hyperfine splittings. Hyperfine levels of the clock states, specified by $F_g$ and $F_e$, are resolved by the two-photon transition. A bias magnetic field (1 μT is chosen experimentally) aligned along the laser beam axis is sufficiently large to define the quantization axis, though accompanying Zeeman splittings are unresolved. The initial ground-state population is evenly distributed among the magnetic substrates. From second-order time-dependent perturbation theory, the transition rate reads $$w_{g\to e} = I_1 I_2 \frac{A\pi D_{ek}^2 D_{kg}^2}{2\hbar^4 \epsilon_0^2 c^2} \left( \frac{1}{\omega_{kg}-\omega_1} + \frac{1}{\omega_{kg}-\omega_2} \right)^2 \times \delta(\omega_1+\omega_2-\omega_{eg}) \quad (1)$$

where $\epsilon_0$ is the permittivity of free space and c is the speed of light. The Dirac δ function appearing here is a proxy for a lineshape function of function finite bandwidth. Finally, the factor A depends on the initial and final hyperfine levels, with values specified in Table I.

While the two lasers drive the clock transition, they also induce ac Stark shifts to the clock levels, $$\delta E_g = -\left(\frac{I_1}{2\epsilon_0 c}\right)\alpha_g(\omega_1) - \left(\frac{I_2}{2\epsilon_0 c}\right)\alpha_g(\omega_2), \quad (2)$$

$$\delta E_e = -\left(\frac{I_1}{2\epsilon_0 c}\right)\alpha_e(\omega_1) - \left(\frac{I_2}{2\epsilon_0 c}\right)\alpha_e(\omega_2)$$

with ac polarizabilities given by $$\alpha_g(\omega) = \frac{1}{3\hbar}\left( D_{kg}^2 \frac{\omega_{kg}}{\omega_{kg}^2-\omega^2} + D_{lg}^2 \frac{\omega_{lg}}{\omega_{lg}^2-\omega^2} \right),$$

$$\alpha_e(\omega) = -\frac{1}{9\hbar}(1+B)D_{ek}^2 \frac{\omega_{ek}}{\omega_{ek}^2-\omega^2}.$$

TABLE I

Factors A and B, derived from basic principles of angular momentum theory, for the various transitions $F_g \to F_e$ where $F_g$ and $F_e$ label the hyperfine level f the ground and excited clock states, respectively.

| $F_g \to F_e$ | A | B |
|---|---|---|
| 1 → 1 | 3/800 | 7/50 |
| 1 → 2 | 7/1440 | 1/14 |
| 1 → 3 | 7/1800 | 33/175 |
| n/a | n/a | n/a |
| 2 → 1 | 1/4000 | −7/50 |
| 2 → 2 | 1/800 | −3/98 |
| 2 → 3 | 7/2000 | 33/700 |
| 2 → 4 | 3/400 | 55/196 |

For the ground clock state, this corresponds to the conventional scalar polarizability. For the excited clock state, both scalar and tensor polarizabilities contribute, with the factor B here accounting for the latter. As with A, the factor B depends on the initial and final hyperfine levels, with values specified in Table I.

Introducing the quantity $$R \equiv -\frac{\alpha_e(\omega_2)-\alpha_g(\omega_2)}{\alpha_e(\omega_1)-\alpha_g(\omega_1)},$$

it can be seen from Eq. (2) that the clock frequency is unperturbed when operating with the intensity ratio $$\frac{I_1}{I_2} = R.$$

For the case $\omega_1=\omega_2$, the clock shift is simply preoperational to the sum intensities, $I_1+I_2$, and no intensity ratio can null it. This is reflected in the negative result for R, namely R=−1. For $\omega_1 \neq \omega_2$, on the other hand, R can accommodate positive values, allowing the clock shift to be precisely nulled with the appropriate intensity ratio. To explore this further, it can be assumed that the resonance condition $\omega_1+\omega_2=\omega_{eg}$ and parametrize the laser frequencies with detuning Δ according to $$\omega_1=\omega_{kg}+\Delta,$$

$$\omega_2=\omega_{ek}-\Delta.$$

In the limit Δ→0, the result $$R \to \left[\frac{1+B}{3}\right]\left(\frac{D_{ek}}{D_{kg}}\right)^2$$

is obtained, which is positive for each transition in Table I. Increasing Δ moves towards the case $\omega_1=\omega_2$ and negative values of R. Taking transition frequencies $\omega_{ij}$ from references and dipole matrix elements $D_{ij}$ from references and expanding to second order in Δ, the $F_g=2$, $F_e=4$ transition is found $$R=(0.0656)[1-(8.06\times10^{-3})\Delta-(3.19\times10^{-6})\Delta^2],$$

where Δ is in units of 2π×GHz. The second-order expansion here is an excellent approximation through the zero crossing at $$\frac{\Delta}{2\pi} = 118 \text{ GHz}.$$

In practice, the choice $$\frac{\Delta}{2\pi} = 10$$

GHz marks a good compromise; this is sufficiently well detuned from the electric dipole transitions, while an intensity ratio of $$\frac{I_1}{I_2} = 0.0602$$

can be used to drive the clock transition with zero ac Stark shift. For this operational condition, a 1% single laser beam intensity change leads to a change in the ac Stark shift a factor of two lower than in the single-color case with equal beam intensities and identical transition rate (accounting only for transitions with a photon absorbed from each counter-propagating beam).

Two-Photon Rb Spectroscopy

Figure 4A:
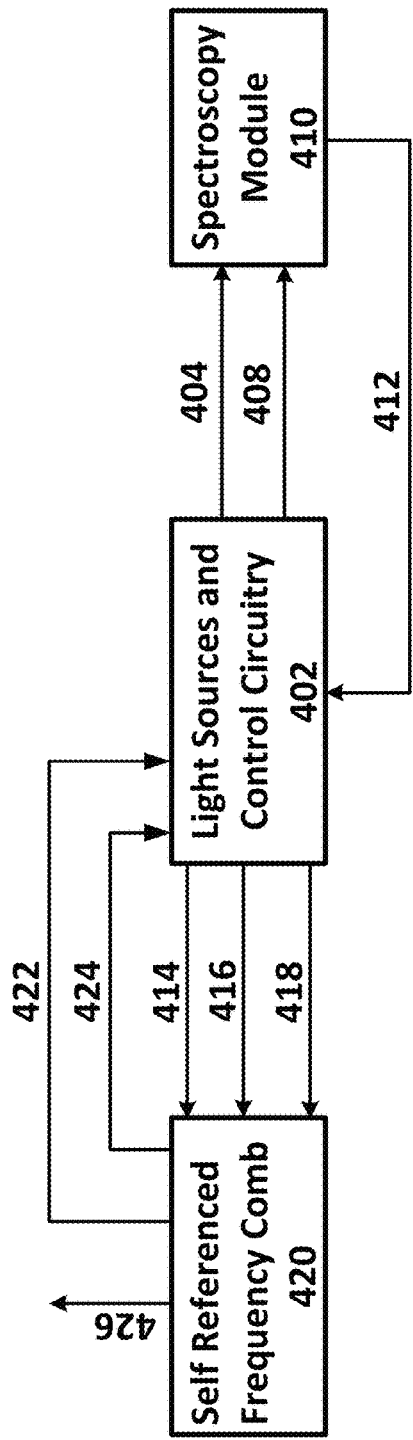
FIG. 4A is a schematic block diagram illustrating the stabilization process of the device of FIGS. 2A-2C according to various embodiments of the present technology.

FIG. 4A is a schematic block diagram 400 illustrating an example the stabilization process of the device of FIGS. 2A-2C. As illustrated in FIG. 4A, light sources 402 send two input light fields 404 and 408 at different frequencies, $\omega_1$ and $\omega_2$ to spectroscopy module 410. As a result, the feedback values and process are more complicated. In addition, the power of the $\omega_1$ beam can be lower than that used in the conventional systems (see, e.g., FIG. 1A-1C), which allows absorption detection of the remaining $\omega_1$ light after the absorber (see, e.g., 204 in FIG. 2C) with reduced light relative intensity noise (RIN) and photon shot noise contributions, resulting in a higher signal to noise ratio.

Light source 402 can send one or more signals 414, 418, and/or 416 to frequency comb 420. Signal 414 represents light field at $\omega_2$ optical frequency for $\omega_2$ optical frequency locking to comb 420. The optional signal 416 represents the sum frequency feedback. Signal 418 represents the light at $\omega_1$ optical frequency for $\omega_1$ optical frequency locking to the comb. Comb can produce feedback signal 422 for $\omega_2$ optical frequency locking to comb 420 and feedback signal 424 for $\omega_1$ optical frequency locking to comb 420.

Figure 4B:
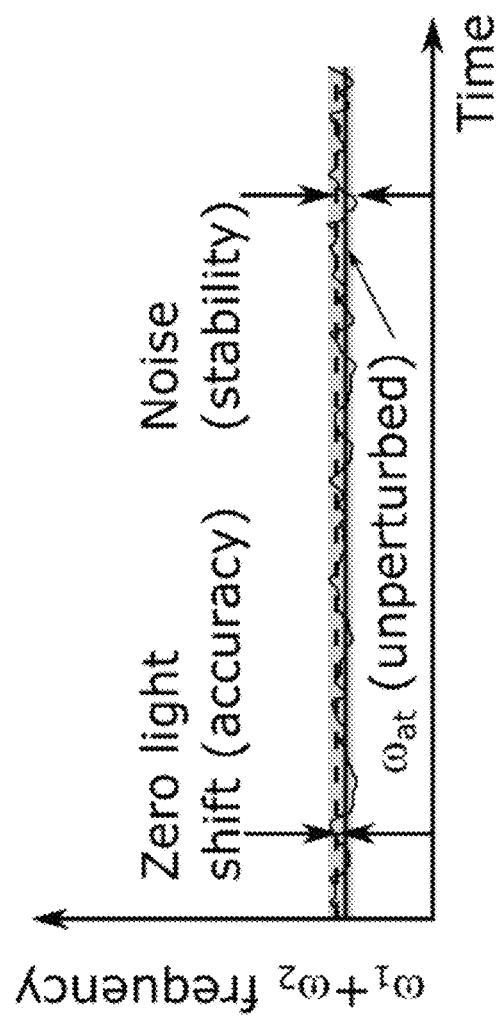
FIG. 4B is a plot illustrating the output frequency noise, and the frequency offset/drift (due to AC Stark shift of $\omega_{at}$ caused by the presence of light) of the output frequency of the device of FIG. 4A.

FIG. 4B is an example of a plot illustrating noise and offset drift of the optical frequency sum $\omega_1+\omega_2$ (stabilized to $\omega_{at}$) of the device of FIG. 4A. Note that compared to FIG. 3B, the frequency noise produced by the conventional systems is significantly reduced, and the offset of the frequency sum $\omega_1+\omega_2$ from the unperturbed $\omega_{at}$ is near-zero (the residual offset is due to frequency shifts unrelated to the light shift) and does not drift with fluctuations of the light powers/intensities when the atom-based intensity ratio stabilization feedback is implemented. Since the device's output frequency is derived from the comb's repetition rate $f_{rep}$ that determines the frequency sum $\omega_1+\omega_2$, it also shows reduced noise and drift. The noise reduction is due to the more efficient detection to that used in FIGS. 1A-1C, and in some embodiments removes the need for a high-finesse cavity (see, e.g., the cavity used in U.S. Pat. No. 8,780,948 which is hereby incorporated by reference in its entirety for all purposes) to improve the output frequency noise of the rubidium optical frequency reference.

In accordance with various embodiments, two light fields at wavelengths of 780 and 776 nm can excite the transition when the sum of their optical frequencies $\omega_1$ and $\omega_2$ matches the two-photon frequency $\omega_{2ph}$. The 780 nm light is blue detuned $$\left(\frac{\Delta}{2\pi} = 10 \text{ GHz}\right)$$

from the $5s^2S_{1/2} \rightarrow 5p^2P_{3/2}$ transition at 780 nm for reasons discussed below. The sum of the optical frequencies is stabilized to the two-photon atomic transition. If both light fields are locked to respective optical components of a self-referenced optical frequency comb, the single degree of freedom—the comb repetition rate—can be referenced to the atomic transition frequency by the relation $\omega_{2ph}=\omega_1+\omega_2=2\pi\times((N_1+N_2)\times f_{rep}+2f_{CEO})$, with $N_1$ and $N_2$ the two frequency comb components to which $\omega_1$ and $\omega_2$ are locked.

Figure 10:
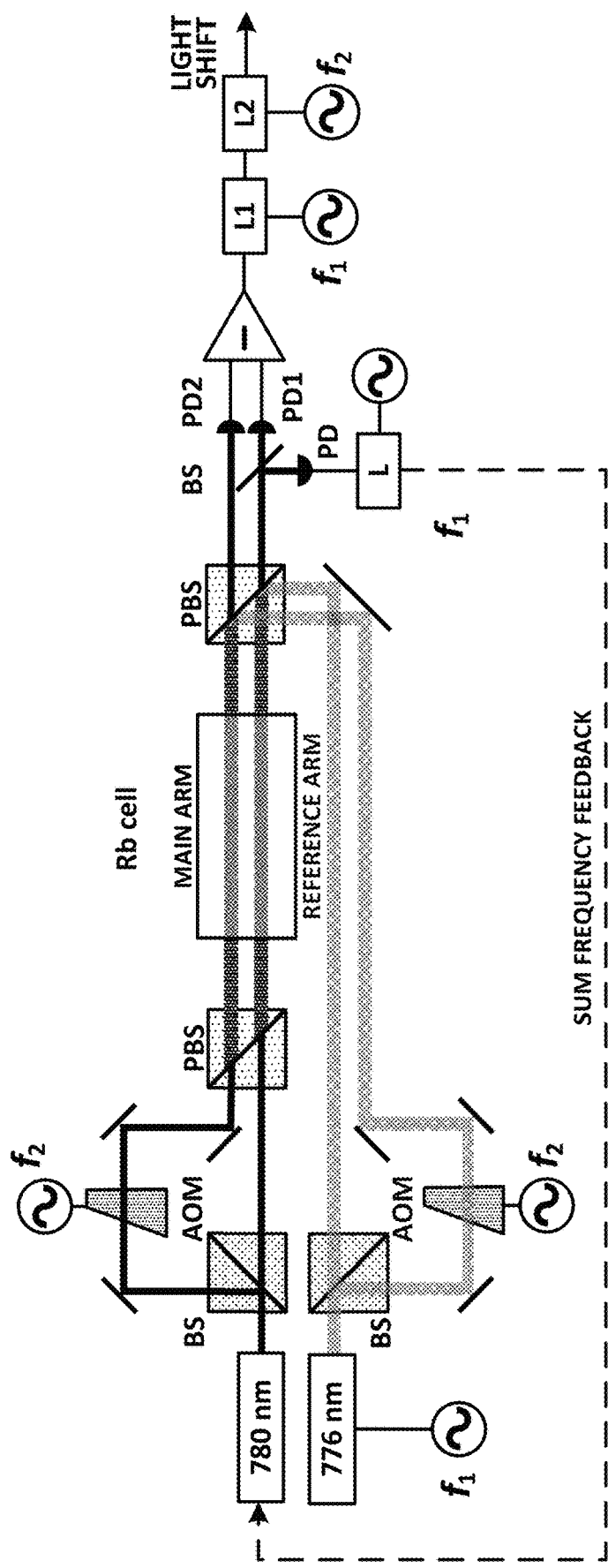
FIG. 10 illustrates an example of an experimental setup for ac Stark shift cancellation study where the laser intensities can be modulated independently with AOMs.

Two lasers ant 780 nm and 776 nm are used in a two-photon two-color scheme (see, e.g., FIG. 10). The optical frequency of the 776 nm laser is frequency modulated (FM) at a frequency $f_1$. The output beams of both lasers are collimated, linearly polarized, and overlapped to propagate in the same direction with orthogonal polarizations. The two beams pass a common modulator (shown in an acousto-optic modulator example) performing same-depth intensity modulation of both laser beams at a frequency $f_2$. The two intensity-modulated beams are spatially separated using a polarizing beam splitter, and recombined in a Rb vapor cell in a counter-propagating configuration. The 780 nm laser beam is detected, and demodulated at the frequency $f_1$ (modulation-transfer spectroscopy) with the lock-in amplifier L1, providing a feedback signal for locking the repetition rate $f_{rep}$ of the self-referenced frequency comb to the atomic transition. A second demodulation of the L1 output signal feedback signal is performed with the lock-in amplifier L2 at the intensity modulation frequency $f_2$. The output of the lock-in amplifier L2 provides an intensity ratio feedback signal derived from the atomic resonance response to the intensity modulation. This feedback signal can be used to keep the intensity ratio at the value that cancels the differential ac Stark shift experienced by the atoms by changing the output power of one of the lasers (shown in the 776 nm laser example).

The use of the two-color scheme for two-photon Rb spectroscopy has some drawbacks. The use of two lasers requires control of the laser-frequency difference when the sum frequency is stabilized to the atomic transition. As the reference is intended to operate in combination with a frequency comb, the frequency difference can be controlled by referencing the lasers to the comb. The effective atomic transition linewidth is increased due to the contributions from residual Doppler broadening and both laser linewidths (which can be made negligible with existing telecom-based lasers). The residual Doppler broadening also reduces the amount of atoms interacting with the light by a factor of 3 due to velocity class selection.

At the same time, the increased detection efficiency and interaction volume compensate for these two effects. The detection efficiency is approximately 10 times higher since the branching ratios of the excited clock state decay do not play a role. The transition rate is proportional to $\frac{1}{2}\Delta^2$ and is increased by a factor of approximately $5\times10^3$ in the two-color case, allowing a reduction of the laser intensities and correspondingly larger interaction volume under the condition of the same total laser power and transition rate. The intensity modulation depth required for the ac Stark shift cancellation must be the same for the two laser beams of different frequencies, which can be accomplished by using the same modulator. Finally, the signal detection has a contribution from the intensity noise and photon shot noise of the 780 nm laser beam, and an intensity noise suppression might be required.

Figure 5:
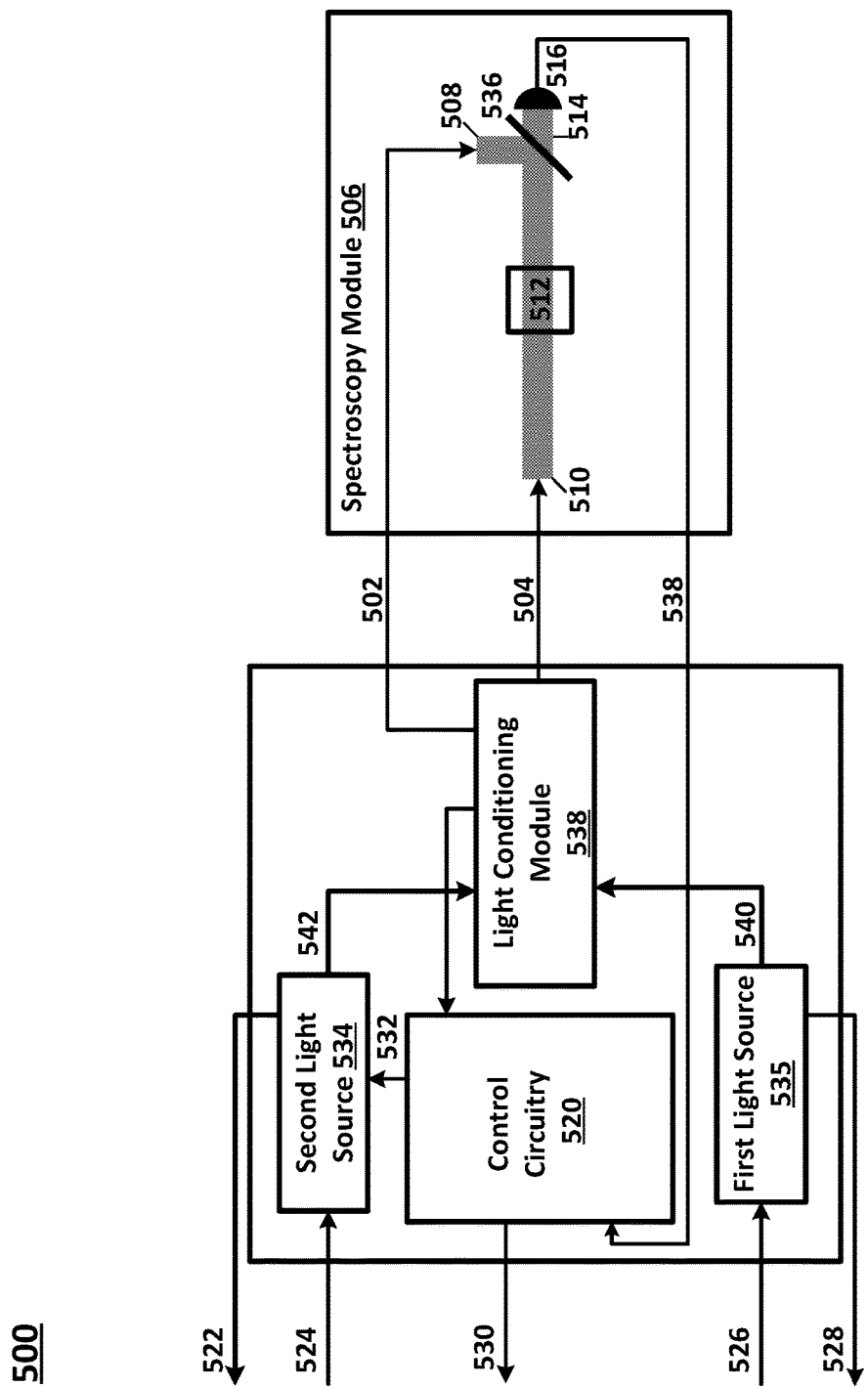
FIG. 5 is a block diagram illustrating a first embodiment of the device of FIGS. 2A-C and 4A.

FIG. 5 is a block diagram illustrating an example of some embodiments the device of FIGS. 2A-2C and 4A. As illustrated in FIG. 5, two light beams 502, 504 having different optical frequencies are sent to spectroscopy module 506. Two light beams 508 and 510 are formed from 502 and 504 and counter-propagated through an atomic absorber 512 which has an atomic transition frequency equal to (or nearly equal to) the sum of the frequencies of the 508 and 510 beams. The 508 beam is sent to the absorber 512 with a splitter/combiner 536 that transmits light at the frequency of beam 510. When the two optical frequencies are appropriately tuned, the atomic absorber absorbs some of the light from each beam. The amount of light 514 detected after the absorber 512 by the detector 516 is an indication of how well the sum of the two beam frequencies are tuned to the atomic absorber resonance frequency.

In addition, at least one of the beams 508 or 510 (in this example, 508) has an FM modulation of its optical frequency prior to the atomic absorber, which is accomplished by 534 or 535 (in this example, by 534). The FM modulation results in general in a modulation of the remaining light 514 with a given amplitude and phase (modulation transfer spectroscopy). This modulation can be compared to the original FM modulation and can be used to generate a sum frequency feedback signal 530 by signal processing of the remaining light signal 514 which is detected by 516 and sent to the control circuitry 520. This feedback is used to adjust the sum of the light beam frequencies to match the atomic absorber transition frequency $\omega_{at}$. In one implementation, the optical frequency of each beam is stabilized to a corresponding component of a frequency comb (see, e.g., FIG. 4A) using 522, 524, 526 and 528 so that the repetition rate $f_{rep}$ of the comb is the parameter adjusted to match the beam frequencies to the atomic absorber transition frequency $\omega_{at}$, realizing an optical frequency reference.

Finally, the overlapped beams (see, e.g., FIG. 6) have a common amplitude modulation (AM) applied to them by common-mode AM modulator 552 before the atomic absorber 512. In general, the common AM modulation causes (through the AC Stark shift) a corresponding modulation of the sum frequency feedback signal 530 with a given amplitude and phase. When compared to the original AM modulation signal by circuitry 520, this modulation can be used to generate an intensity ratio feedback signal for the ratio of the intensities of the two beams within the absorber. The intensity ratio feedback signal 532 (FIG. 5) is used to bring the actual intensity ratio to the value corresponding to zero light shift of the atomic resonance frequency $\omega_{at}$ and is accomplished by controlling the power of one of the light beams, in this example by sending feedback signal 532 (FIG. 5) to second light source 534. This feedback is useful if the intensity of one or both beams within the absorber drifts, as it is used to bring their ratio back to the zero light shift value, removing systematic offset and drift of the atomic absorber transition frequency $\omega_{at}$ caused by intensity drift(s) of one or both light beam within the absorber 512.

The frequencies $\omega_1$ and $\omega_2$ are stabilized to corresponding components of the frequency comb as shown in FIGS. 2B and 4A. The optical frequency $\omega_2$ is FM-modulated. The common-mode AM modulator is used to reduce systematic offsets in the light shift cancellation scheme, but in general the intensity modulation can also be provided by independent modulators. The Splitter/Combiner 536 allows light beam co-propagation, separation and detection of one light field (typically at frequency $\omega_1$) without the contribution from the other (typically at frequency $\omega_2$). In this case, the output signal 538 is processed (demodulated) to create a sum frequency feedback signal 530 for stabilizing the sum of $\omega_1$ and $\omega_2$ frequencies to the absorber transition frequency $\omega_{at}$, as well as a feedback signal for beam intensity ratio adjustment as shown in FIG. 4A.

The FM modulation of one beam frequency and demodulation of the remaining light signal from the other beam allows the use of the modulation transfer spectroscopy technique (see, e.g., J. H. Shirley, "Modulation transfer processes in optical heterodyne saturation spectroscopy" Opt. Lett. 7, 11, 537-539, 1982), which offers reduced systematic effects compared to the conventional method of FM modulation of the light at frequency $\omega_{778}$ and demodulation of the detected light at frequency $\omega_{420}$.

Improved device accuracy (reduced offset between the unperturbed $\omega_{at}$ and actual $\omega_{at}$ frequency) and stability (reduced drift of the output frequency of the frequency reference) is achieved through light shift cancellation (the frequency light shift offset is removed). The light shift cancellation is achieved by intensity ratio feedback provided by the atomic absorber (atom-based stabilization, a superior technique over external reference intensity stabilization schemes through light power measurements—see Gerginov et al., "Two-photon Optical Frequency Reference with Active ac Stark Shift Cancellation" Phys. Rev. Applied 10, 014031, 2018).

Figure 6:
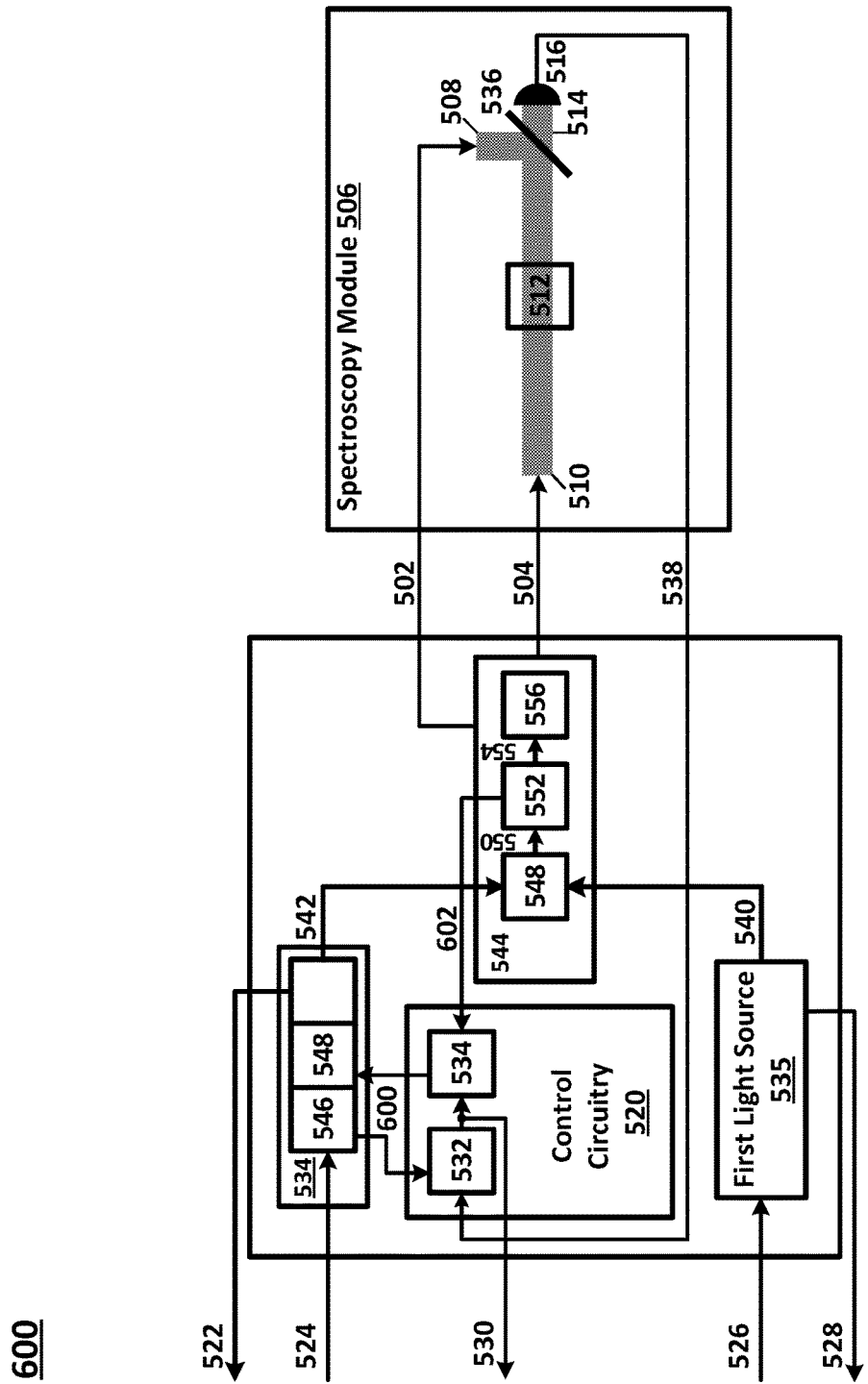
FIG. 6 is a more detailed block diagram of the embodiment of FIG. 5.

FIG. 6 is functional block diagram 600 illustrating examples of various components that may be present in some embodiments of the present technology. The light sources and control circuitry block include control circuitry 520 and light sources 534 and 535. Block 544 conditions the light beams. Light source 535 provides the first beam 540 at frequency $\omega_1$ to be conditioned, while light source 534 provides second beam 542 at frequency $\omega_2$ to be conditioned. At least one of the beams 540 and 542 is FM-modulated (in this case 542). From light conditioning module 544, 504 is conditioned light output at optical frequency $\omega_1$, while 502 is conditioned light output at optical frequency $\omega_2$.

Block 506 is the spectroscopy module. At atomic absorber 512, input light at frequency $\omega_1$ is 510 and input light at frequency $\omega_2$ is 508 (directed by Splitter/combiner 536). 514 is the remaining light at frequency $\omega_1$ after absorber 512 that passes through the splitter/combiner 536. Detector 516 measures transmitted power of light with light frequency $\omega_1$ and provides a signal 538 corresponding to light power at frequency $\omega_1$ after the absorber which will be used to generate sum frequency feedback signal 530 (better shown in FIG. 7).

Figure 7:
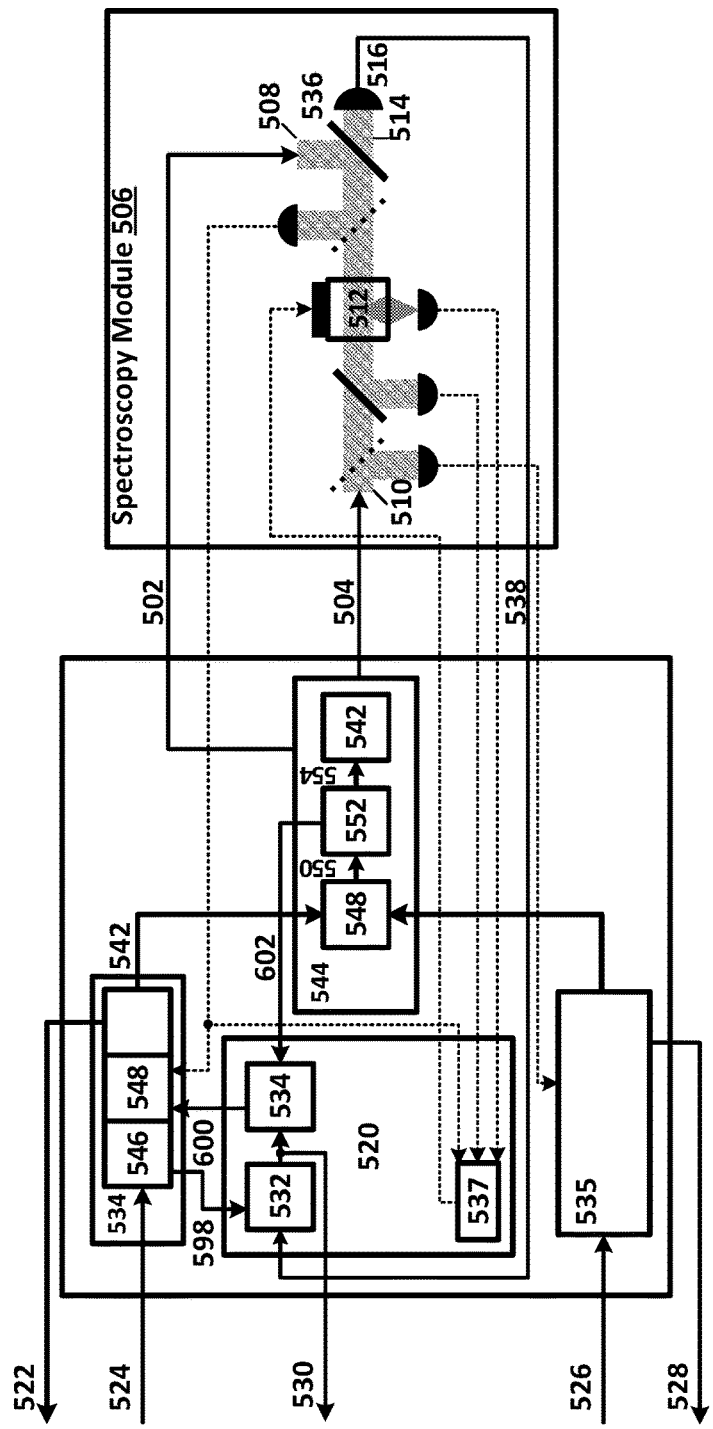
FIG. 7 is a version of FIG. 6 with optional elements.

In the embodiments shown in FIGS. 6 and 7, one of the beams (542) is FM-modulated (by 544) to allow sum frequency feedback signal 530 to be generated, and power-adjusted by 548 to allow adjustment of the beam intensity ratio within the absorber to the value corresponding to zero light shift. Those skilled in the art will appreciate that the FM modulation and power adjustment could instead be applied to beam 540.

Light conditioning module 544 conditions beams 540 and 542 before they are inserted into atomic absorber 512. Spatial mode filter 548 produces spatially overlapped beams 550 having the same spatial profile, which in turn are AM-modulated by 552, producing signal 554. The common-mode spatial mode filter 548 provides the same profile to each light beam, which improves the accuracy of the intensity ratio stabilization. Splitter/combiner 556 separates the two overlapped beams into 504 beam of frequency $\omega_1$ and 502 beam of frequency $\omega_2$, providing similar intensity profile for each beam, which also improves the accuracy of the intensity ratio stabilization.

FIG. 7 includes many optional elements that are used in some embodiments to improve performance (generally indicated as dotted lines). In the embodiments illustrated in FIG. 7, the secondary detector 560 provides signal 594 proportional to the optical power of the beam 606 before the absorber 556 that can be used to reduce intensity noise of beam 606 by a feedback to the amplitude control 522 of light source 516. The signal 594 can also be used to generate a feedback signal for the absorber temperature circuitry 537. This atomic absorber-based temperature determination is more accurate than the typically used temperature sensors (see Gerginov et al., "Atomic-based stabilization for light-pumped atomic clocks" Opt. Lett. 31, 12, 1851-1853, 2006).

Similarly, the secondary detector 572 provides signal 592 proportional to the optical power of the beam 604 before the absorber that can be used to reduce intensity noise of beam 604 by a feedback to the amplitude control of light source 518 and could also be sent to circuitry 537 for absorber temperature control (not shown).

The light for secondary detectors 560 and 572 can be sampled before or after the intensity modulator 540 (in FIG. 7, they are sampled after the intensity modulator). This allows reduction of intensity noise and leads to reduced frequency noise of the rubidium optical frequency reference. The secondary detector 570 provides signal 588 proportional to the remaining optical power of the beam 606 after the absorber that can be used by 537 for absorber temperature control. The secondary detector 568 provides signal 590 proportional to the fluoresce signal from the absorber that can be used by 537 for absorber temperature control. The absorber temperature circuitry 537 sends a control signal 596 to the absorber heater 554 to control the absorber temperature.

The sum frequency feedback signal 506 is generated by the phase detector 532. The first light signal has a minimum when the sum of the first frequency and the second frequency matches the frequency of the atomic resonance frequency of the atomic absorber. The phase detector 532 takes signal 586 as input, signal 598 as reference (FM modulation at first modulation frequency), and generates signal 506 as output. The intensity ratio feedback signal 600 is generated by the phase detector 534. The phase detector 534 takes signal 506 as input, signal 602 as reference (AM modulation at second modulation frequency) and generates signal 600 as output. The sampling of the light before and after the absorber allows detection and stabilization of the atomic vapor density through absorption measurement (atom-based stabilization, superior technique over cell temperature stabilization using an external temperature sensor). Temperature instability leads to the second largest systematic frequency shift after the light shift in rubidium optical frequency references, and atom-based temperature stabilization can provide improved long-term temperature, (and respectively frequency) stability.

Figure 8:
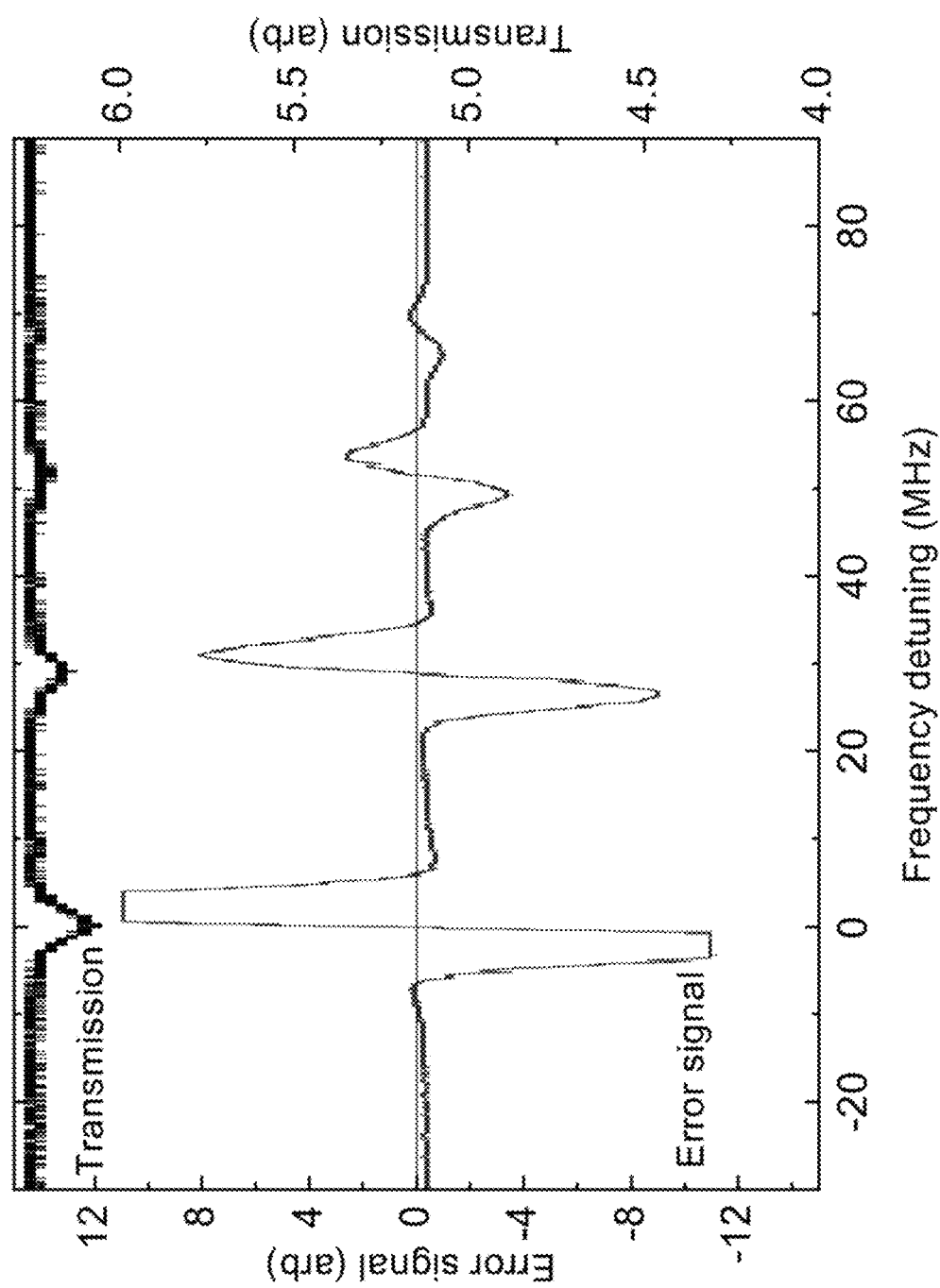
FIG. 8 is a plot showing an example of the performance of some embodiments of the present technology.

FIG. 8 is a plot showing an example of remaining light at frequency $\omega_1$ after the absorber (right scale). Also, the plot shows the sum frequency feedback signal 530 (left scale) obtained by a megahertz-rate FM modulation of the light beam at frequency $\omega_2$ and using modulation transfer spectroscopy to generate sum frequency feedback signal by demodulating the remaining light at frequency $\omega_1$. (See, e.g., J. H. Shirley, "Modulation transfer processes in optical heterodyne saturation spectroscopy," Opt. Lett. 7, 11, 537-539, 1982 which is hereby incorporated by reference in its entirety for all purposes.)

FIG. 8 shows modulation transfer spectroscopy of the two-photon transition between the Fg=2 component of 5s $^2S_{1/2}$ ground atomic state and Fe=4,3,2,1 component of 5d $^2D_{5/2}$ excited atomic state in rubidium-87 (left-to-right features). The light beam at frequency $\omega_2$ (776 nm) was FM-modulated at 3 MHz using an electro-optic modulator. The transmission of the light beam at frequency $\omega_1$ (780 nm) was detected with a photodiode (FIG. 8, right scale). The modulation of the transmission of the light beam at frequency $\omega_1$ (780 nm) at the FM frequency was detected with a phase detector (RF lock-in amplifier, time constant of 100 μs, 18 dB/octave slope). The output of the phase detector is shown in FIG. 8, left scale and can be used as sum frequency feedback signal 506 on FIG. 7. The FM modulation frequency is in the MHz range (in contrast to Previous Art devices that are limited to <1 MHz range due to the fluorescence detector bandwidths).

The higher FM modulation frequency used demonstrate the possibility of acquiring an error signal away from the low frequency range where the frequency demodulation of the light intensity and laser frequency noise (intermodulation effect, see, e.g., C. Audoin, V. Candelier, and N. Dimarcq, in Proceedings of the Conference on Precision Electromagnetic Measurements (CPEM '90), Ottawa, 1990 (IEEE, New York, 1990), p. 93 which is hereby incorporated by reference in its entirety for all purposes) increases the frequency output noise of the rubidium optical frequency reference. The laser light noise in the MHz range is significantly lower, allowing to suppress this source of frequency noise of the rubidium optical frequency reference. Additionally, the higher modulation frequency allows higher sum frequency feedback bandwidth that also leads to reduced rubidium frequency reference instability.

Figure 9:
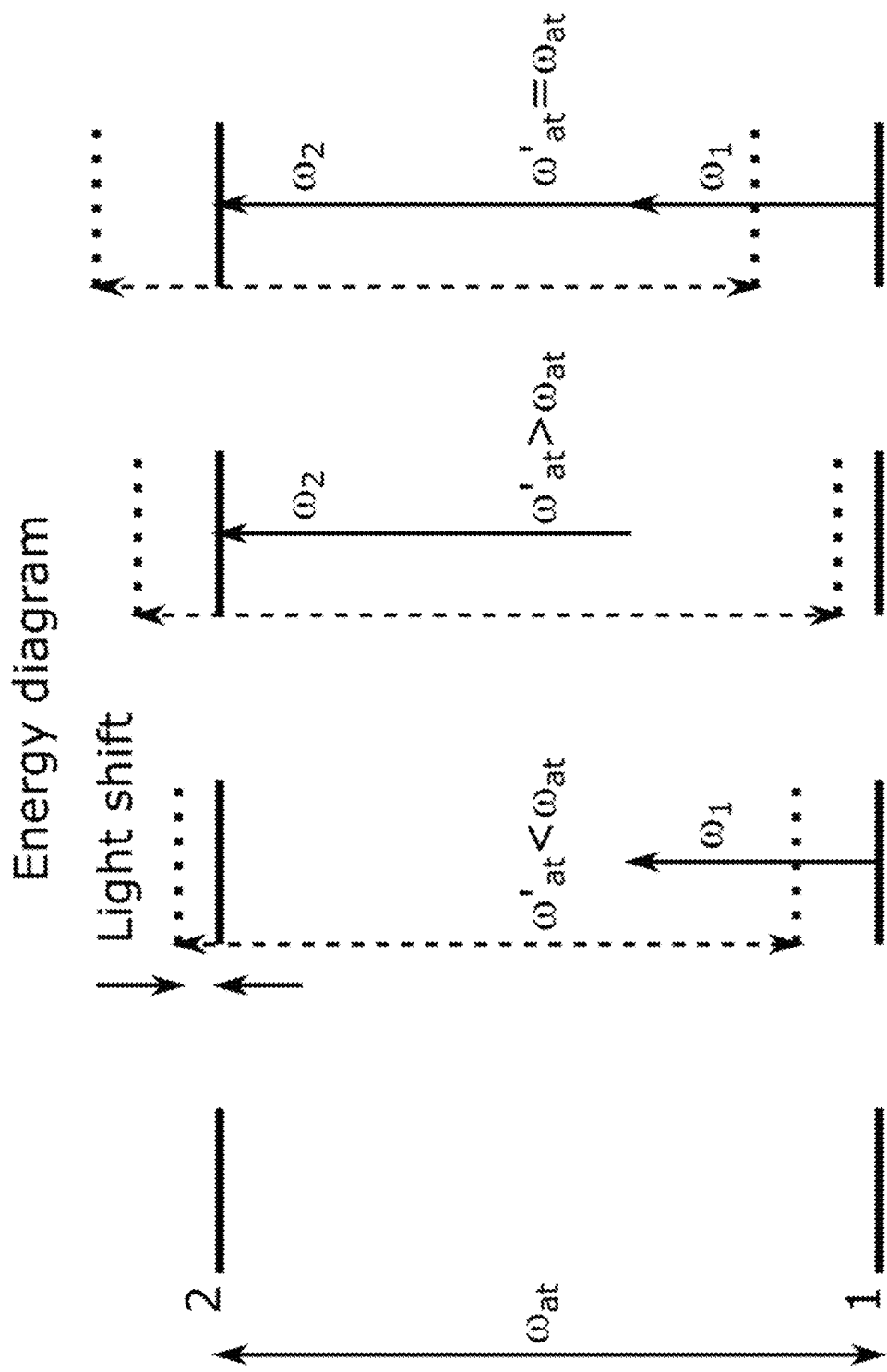
FIG. 9 is a plot illustrating an example of the light shift cancellation method in general terms.

FIG. 9 illustrates the atom-based AC Stark shift cancellation principle. Each of the two light fields with optical frequencies $\omega_1$ and $\omega_2$ shifts the atomic transition frequency $\omega_{at}$ depending on the light field intensities through the AC Stark effect (light shift). Typically, one of the light fields ($\omega_1$) shifts predominantly the energy of one of the atomic states that form the atomic transition (i.e., 1) through the AC Stark effect (light shift) and the other light field ($\omega_2$) shifts predominantly the energy of the other atomic state (i.e., 2) due to their opposite frequency detuning from an atomic transition to which the two light fields couple (not shown). For some atomic systems (for example, the rubidium-87 5s $^2S_{1/2}{\rightarrow}$5d $^2D_{5/2}$ transition) the shifted value of the atomic transition frequency $\omega'_{at}$ caused by the light field at optical frequency $\omega_1$ has an opposite sign to the shift of the atomic transition frequency $\omega'_{at}$ caused predominantly by the light field at optical frequency $\omega_2$. When the two frequency shifts of the atomic resonance frequency have the same magnitude (which can be achieved by controlling the intensity ratio of the two light fields), the effective light shift of the atomic transition frequency becomes zero (light shift cancellation).

Experiment

The proof-of-concept experimental setup for ac Stark shift cancellation is shown in FIG. 10. The optical fields at 776 and 780 nm wavelengths are created by commercial (Littrow configuration) and homemade (Littman configuration) external-cavity diode lasers, each with typical linewidth on the order of 100 kHz. Because of the significant laser-frequency noise, a differential measurement is made between a main spectroscopy arm used to study the ac Stark shifts, and a reference spectroscopy arm used to lock the sum-laser frequency to the two-photon transition and to suppress the common-mode noise between the main and the reference arms. The two independent optical arms with overlapping counter-propagating orthogonally polarized laser beams are created in a single Rb cell. The 25-mm-diameter, 25-mm-length cell is filled with isotopically pure 87Rb and heated to 100° C. The cell is placed in a single-layer magnetic shield. The small magnetic bias field (approximately 1 μT) is applied along the direction of the laser beams.

To demonstrate the ac Stark shift of the two-photon transition caused by the lasers, the laser beams propagate and are intensity modulated independently. The first laser can be tuned by approximately 20 GHz around 776,000(1) nm and provides 25 mW of light at the output of a polarization—maintaining (PM) fiber. The laser current is modulated at frequency $f_1$ 16.5 kHz with a modulation depth of 1.5 MHz. The second laser can be tuned by approximately 2 GHz around 780.221 (1) nm and provides 1.5 mW of light at the output of another PM fiber. The frequency modulation of the first laser causes a corresponding modulation of the transition rate, which in turn leads to a modulation of the transmitted light from the second laser that is used for the detection of the atomic transition.

The reference arm is used for sum-laser-frequency locking using modulation-transfer spectroscopy. The 780 nm light is detected with the photodetector PD and demodulated with the lock-in amplifier L. The L output is used to lock the frequency of the 780 nm laser to that of the free-running 776 nm laser so that the sum-laser frequency equals the two-photon transition frequency. Proportional and integral feedbacks are used for fast (laser diode injection current) and slow (external cavity piezo actuator) frequency control.

The main arm is used to introduce and detect ac Stark shifts. Two acousto-optic modulators (AOMs) are used in zero order to modulate independently the intensity of each laser beam at a frequency $f_2=200$ Hz. The acousto-optic modulations are in phase. The lock-in amplifier L1 demodulates the 780-nm-light frequency modulation at the frequency $f_1$. The lock-in amplifier L1 uses the same reference and settings as L. A differential frequency shift detection between both arms is based on a balanced photodetector, which subtracts parts of the 780 nm signals from each arm. Through the ac Stark effect, an acousto-optic-modulated laser intensity causes a corresponding modulation of the transition frequency in the main arm and at the L1 output. The lock-in amplifier L2 detects the modulation due to the intensity modulation(s) present at the L1 output at the frequency $f_2$. The noise from common-mode sources (such as laser frequency and amplitude noise) in the two arms is suppressed. The output of L2 provides an error signal which could be used to control the intensity ratio of the 776 to 780 nm beams. The amplitude of the error signal depends on the intensity and the modulation depth of each laser beam. For equal modulation depths, the error signal is proportional to the deviation of the intensity ratio from the value corresponding to a zero ac Stark shift.

A two-color two-photon 87Rb spectrum measured with the photodetector PD and the lock-in amplifier L, is shown in FIG. 3. The laser powers are 0.7 mW (at 780 nm) and 14 mW (at 776 nm), with a beam waist of 2 mm. The detuning from the 6p 2P3/2 state is $$\frac{\Delta}{2\pi} = 10 \text{ GHz}.$$

The laser-frequency-noise contribution is clearly visible on the approximately 3.8-MHz-wide transitions, broadened by the residual Doppler effect resulting from the frequency difference of the two counter-propagating beams. The lock-in amplifier L has a time constant of 300 μs. With the 776 nm laser detuned from resonance, measurements of the power spectral density at the L output resulted in 440 $\mu V_{rms}/Hz^{1/2}$, a factor of 2.2 above the noise of the electronics (measured with the light blocked on the PD). This noise level corresponds to a fractional-frequency instability of the sum frequency of $7.7\times 10^{-14}/\sqrt{\tau}$, obtained using a frequency-discriminator slope of 134 kHz/V determined by the slope of the $$5s^2 S_{\frac{1}{2}} (F_g = 2) - 5d^2 D_{\frac{5}{2}} (F_e = 4)$$

spectral component.

Figure 11:
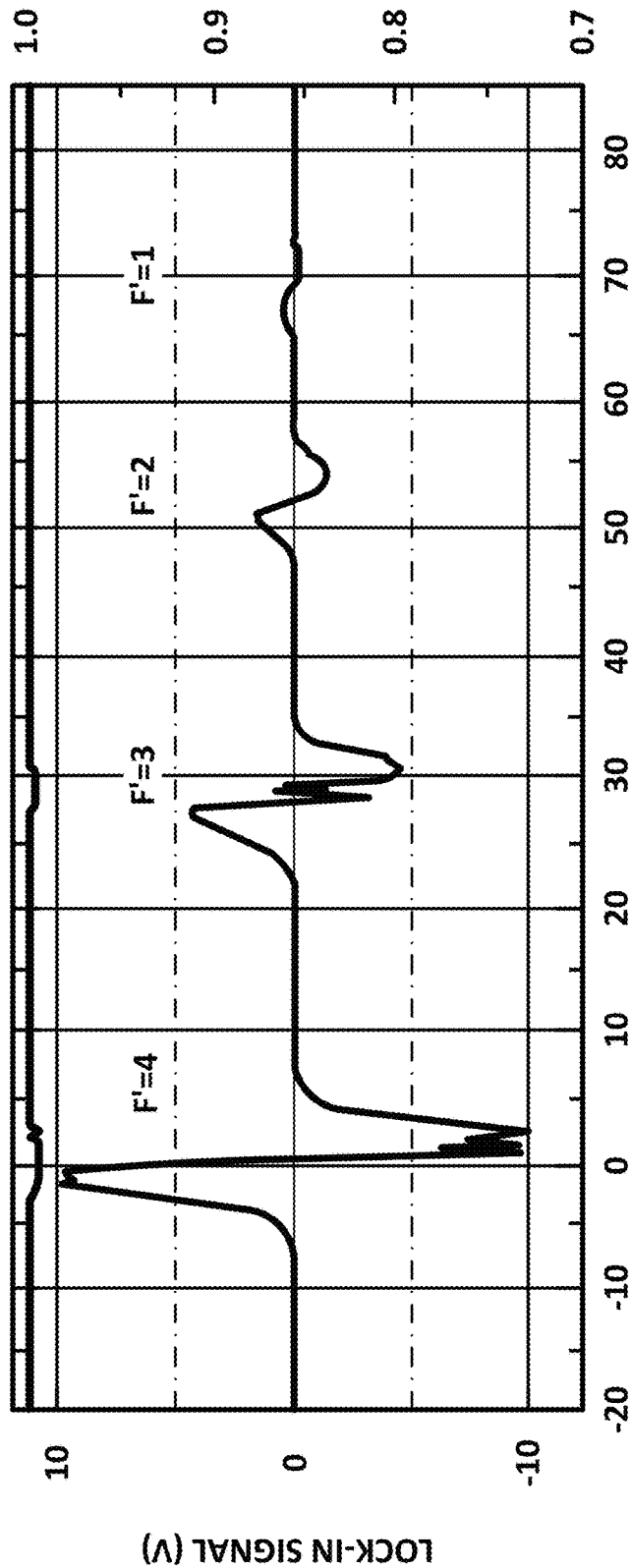
FIG. 11 show an example of a sum frequency feedback (error) signal and a transmission signal from measured from the experimental setup shown in FIG. 10.

With the sum-laser frequency locked to the transition via the reference arm, the ac Stark shift is investigated with the main arm of the spectroscopy setup. The intensity ratio is set close to the theoretically determined value for zero ac Stark shift by measuring the individual laser beam powers and assuming the same beam intensity profiles. A 5% sinusoidal amplitude modulation (AM) at $f_2$ 200 Hz is introduced to each laser beam in the main arm with independent AOMs. The modulation depths are equalized to within 10% by controlling the amplitude of the RF signals delivered to the AOMs. The two AM modulations are phase synchronized during the experiment, and the phase of the lock-in amplifier L2 with respect to the reference frequency $f_2$ is set to zero. The time constant of the lock-in amplifier L2 is 30 s. The output of the lock-in amplifier L2 is used as a measure of the modulation-induced ac Stark shift (error signal, expressed as fractional-frequency deviation). The conversion between voltage at the output of lock-in amplifier L2 and fractional-frequency deviation is performed by using the slope of the frequency discriminator signal (example shown in FIG. 11), and the sensitivity settings of the lock-in amplifier L2.

Figure 12:
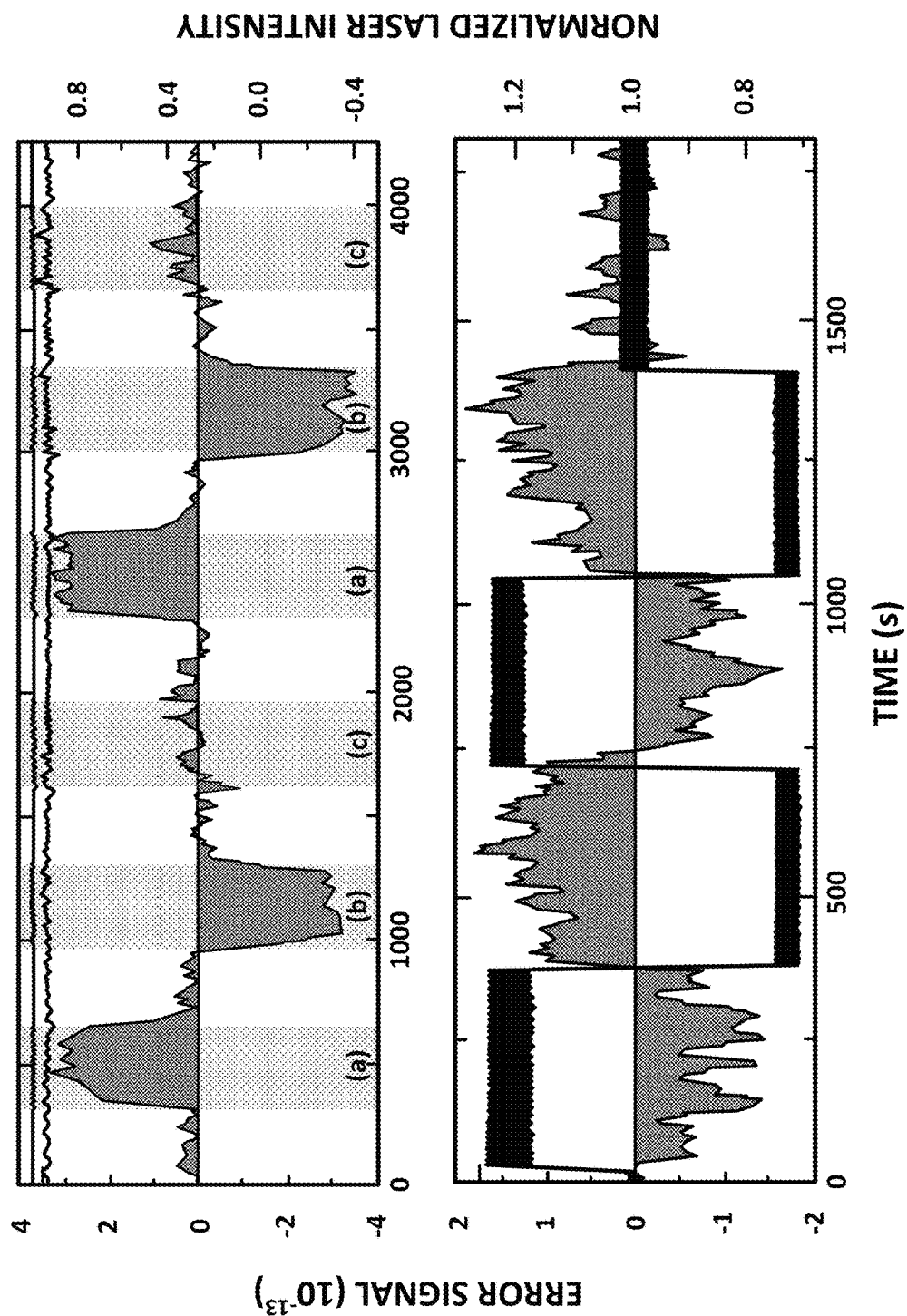
FIG. 12 illustrates an example of an error signal (AC Stark shift expressed as fractional-frequency deviation) and normalized laser intensities (right scale) as a function of time.

The effect of the intensity modulation causing ac Stark shift is illustrated in FIG. 12, top plot. Three cases—(a) to (c)—can be distinguished. In case (a), the 780 nm beam is intensity modulated. The error signal is positive—the transition frequency decreases with increased laser intensity. In case (b), the 776 nm beam is intensity modulated. The error signal is negative, corresponding to an ac Stark shift of the transition which has an opposite sign compared to the shift in case (a). In case (c), both beams are intensity modulated. The error signal is close to zero, since the ac Stark shifts, caused by each light field, have equal magnitude (determined by the equal modulation depths and the chosen intensity ratio) and cancel, leaving the two-photon transition frequency undisturbed by the intensity modulations.

The effect of intensity ratio change is illustrated in FIG. 12, bottom plot. Intensity modulation with the same depth is applied to both 780 and 776 nm beams. The power of the 776 nm beam is varied (changing the intensity ratio as well as the absolute intensity modulation depth). The intensity ratio is changed within 50% around the zero ac Stark shift value. The error signal is negative when the intensity ratio of the 776 and 780 nm beams is above the zero shift value, positive when the ratio is below the zero shift value, and can be used to actively stabilize the ratio to the zero ac Stark shift value.

The ac Stark shift signals shown in FIG. 12 are at the $10^{-13}$ level, showing signal-to-noise ratios of less than 5. The signal-to-noise ratio is mostly determined by residual laser frequency fluctuations, laser intensity fluctuations, and lock-in amplifier L2 time constant of 30 s. It is expected that the residual ac Stark shift to be below the $10^{-14}$ level when narrower-linewidth lasers, reduced laser intensity noise, and longer-time constants are used. Time constants longer than 100 s as the ac Stark shift cancellation is intended to improve the long-term stability of the system.

Cancellation of the ac Stark shift has already been proposed for microwave frequency references. In certain cases, the cancellation is performed without additional modulation apart from the one required for frequency locking. The techniques rely on significant atomic absorption to cause significant amplitude modulation, and on the atomic transition symmetry in order to extract information about the ac Stark shift and cancel it. In the experiment described in this work, frequency modulation of the 776 nm light is used to lock the sum-laser frequency to the atomic transition, and the expected atomic absorption will be above 1%. It might be possible to make use of the resulting light amplitude modulation of the light fields resulting from the FM-to-AM conversion in the presence of frequency-dependent atom absorption, and apply the ac Stark shift cancellation method proposed here without an additional intensity modulation.

Single-Color Vs. Two-Color Two-Photon Spectroscopy

A parameter comparison between a single-color and two-color two-photon optical frequency references and is given in Table II. A detuning $$\frac{\Delta}{2\pi} = 10 \text{ GHz}$$

for the two-color case, and imposing the condition of equal transition rates for the single-color and the two-color schemes can be considered. The Rb cell is assumed L 100 mm long, at a temperature of 90° C., corresponding to a pressure of 31 mPa and a Rb vapor density of $3.1 \times 10^{12}/cm^3$. The natural linewidth of the two-photon transition is taken from references. The stability at 1 s $\sigma_y$ (1s) is calculated in the fractional-frequency units according to the formula $$\sigma_y(1s) = \frac{\delta\omega}{\omega_{2ph}} \frac{1}{SNR} \quad (3)$$

where $\delta\omega$ is the effective transition linewidth and SNR is the signal-to-noise ratio [given by the square root of the number of detected atoms per second in the quantum-projection noise- (QPN-) limited case].

decaying to the 6p $^2P_{3/2}$ state, and 31% of the atoms in this state emitting 420 nm photons. The detection efficiency is given as the product of the branching ratios, the fluorescence light collection efficiency of the optical system (typically 20%), and the photomultiplier tube (PMT) quantum efficiency (typical 30% at 420 nm). The additional signal loss due to resonant 420 nm fluorescence re-absorption is neglected. The ac Stark shift for 1% single-laser beam intensity change is calculated using the formulas from from references.

For the two-color setup, the laser beams are assumed collimated to 2 mm diameter, with powers $P_{780}$=1.2 mW and $P_{776}$=19.2 mW, and intensity ratio as required for the ac Stark shift cancellation. The active volume is calculated as $\pi d^2 L/4$. The transit time broadening is reduced to 30 kHz due to the larger beam diameter. Because of the different wavelengths of the two laser beams, the residual Doppler broadening of the two-photon transition is $(\omega_1-\omega_2)\Delta f_{2ph}/\omega_{2ph}$=2.76 MHz, with $\Delta f_{2ph}$ the Doppler width of the two-photon transition. Because of the increased interaction volume, the signal can be efficiently detected in absorption. The absorption of the 780 nm light is preferable as the ratio of photon scattering rate to the beam photon flux is larger than that at 776 nm (as well as at 778 nm in the single-color case). There is no reabsorption of the detected 780 nm light except due to resonant two-photon excitation (in contrast to the fluorescence at 420 nm). In this case the branching ratios do not play a role, and the light collection efficiency is 100%. A typical Si photodiode quantum efficiency is 65% at 780 nm. The number of detected atoms per second is reduced by a factor of 3 due to the residual Doppler effect causing excitation of a specific velocity class. The stability at 1 s is

TABLE II

Two-photon Rb optical reference parameters. Second column, single-color case. Third column, two-color case. σB(LS) is the fractional-frequency uncertainty caused by 1% variation of single-beam intensity.

| Parameter | Single-color | Two-color |
| --- | --- | --- |
| Wavelength (nm) | 778/778 | 776/780 |
| Frequency $\omega_{2ph}/2\pi$ (kHz) | 2 × 385,285,142,375 | 2 × 385,285,142,375 |
| Laser power (mW) | 10.0/10.0 | 19.2/1.2 |
| Beam waist (mm) | 0.4 | 2 |
| Active volume (mm3) | 13 | 314 |
| Virt. state det. $\Delta_R/2\pi$ (GHz) | 1054 | 10 |
| Nat. linewidth (MHz) | 0.667 | 0.067 |
| Res. Doppler width (MHz) | n/a | 2.79 |
| Transit broadening (MHz) | 0.128 | 0.027 |
| Eff. linewidth $\delta\omega/2\pi$ (MHz) | 0.795 | 3.48 |
| Cell temperature (° C.) | 90 | 90 |
| Branching ratio | 0.35 × 0.31 | n/a |
| Light collection efficiency | 0.2 | n/a |
| Quantum efficiency | 0.3 (PMT) | 0.65(Si) |
| SNR, ×10⁶ | 0.5 | 28 |
| $\sigma_y$ (1 S), ×10⁻¹⁵ | 2.2 | 0.3 |
| $\sigma_B$(LS) (1%), ×10⁻¹³ | 1.8 | 0.87 |

For the single-color setup, the laser beams are assumed focused to a waist waste $\omega_{2A}$=0.4 mm and have 10 mW power per beam, corresponding to a Rayleigh length $z_R = \pi w_0^2/\lambda_{778}$=0.7 m. It is assumed that the beam waist does not change significantly over the cell length, and the active volume is calculated as $\pi w_0^2 L/4$. With a thermal velocity of 170 m/s, the transit time broadening is 130 kHz. Fluorescence detection is used, as detection of a small signal on a large background is challenging. The efficiency of the transition detection for this setup is reduced by the branching ratio of the excited state, with only 35% of the excited state more than seven times higher than in the single-color case, and the ac Stark shift for 1% single-laser beam intensity change is two times lower than the value in the single-color case.

The results shown above show that for the same transition rate, the stability σA(1s) of the two-color scheme is seven times better than the single-color one due to the higher detection efficiency. The absorption measurement eliminates the need for a photomultiplier typically used in fluorescence detection. The 1% intensity change ac Stark shift systematic uncertainty σB(LS), the largest source of systematic uncertainty in this type of reference, is a factor of 2 lower for the two-color reference compared to the single-color one. This uncertainty can be completely removed with the demonstrated ac Stark shift cancellation technique, making the reference more accurate. The two-laser scheme allows the use of modulation-transfer spectroscopy. The use of collimated beams simplifies the experimental setup, as no buildup cavity or focusing are required, opening the possibility for a multipass cell arrangement that would improve the SNR and the reference stability. A frequency reference is characterized by its stability and accuracy, and the two-color scheme offers improvement of both.

In summary, the two-color scheme described in this work offers the possibility of building a rubidium frequency reference based on telecom components with the option of controlling the largest systematic uncertainty contributions to levels below $10^{-13}/\tau$. Such a device would fulfill the growing need for optical frequency references that outperform their commercial microwave counterparts both in the short and long term, and can operate with relaxed environmental control requirements compared to optical references based on cold atoms.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the technology is not intended to be exhaustive or to limit the technology to the precise form disclosed above. While specific examples for the technology are described above for illustrative purposes, various equivalent modifications are possible within the scope of the technology, as those skilled in the relevant art will recognize. For example, while processes or blocks are presented in a given order, alternative implementations may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed or implemented in parallel, or may be performed at different times. Further any specific numbers noted herein are only examples: alternative implementations may employ differing values or ranges.

The teachings of the technology provided herein can be applied to other systems, not necessarily the system described above. The elements and acts of the various examples described above can be combined to provide further implementations of the technology. Some alternative implementations of the technology may include not only additional elements to those implementations noted above, but also may include fewer elements.

These and other changes can be made to the technology in light of the above Detailed Description. While the above description describes certain examples of the technology, and describes the best mode contemplated, no matter how detailed the above appears in text, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the above Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while only one aspect of the technology may be recited in a particular claim format (e.g., system claim, method claim, computer-readable medium claim, etc.), other aspects may likewise be embodied in those claim formats, or in other forms, such as being embodied in a means-plus-function claim. Any claims intended to be treated under 35 U.S.C. § 112(f) will begin with the words "means for", but use of the term "for" in any other context is not intended to invoke treatment under 35 U.S.C. § 112(f). Accordingly, the applicant reserves the right to pursue additional claims after filing this application to pursue such additional claim forms, in either this application or in a continuing application.

What is claimed is:

1. A system comprising:
   a spectroscopy module having an atomic absorber and a photodetector;
   a first light source to generate a first light signal at a first frequency;
   a second light source to generate a second light signal at a second frequency different from the first frequency, wherein the sum of the first frequency and the second frequency is approximately equal to an atomic absorber resonance frequency of the atomic absorber;
   a control module configured to:
      modulate amplitudes of both the first and second light signals at the same modulation frequency;
      generate a first feedback signal based on a signal corresponding to light power of the first light signal after the atomic absorber that stabilizes the sum of the first and the second light signal frequencies to the atomic absorber resonance frequency;
      generate a second feedback signal based on a response of the first feedback signal to the modulated amplitudes of the first and second light signals; and
      control light signal intensities of both the first and second light sources to stabilize frequency drifts of the system caused by changes in any of the light signal intensities at the atomic absorber; and a self-referenced frequency comb having a repetition rate stabilized by the atomic absorber resonance frequency based upon the first feedback signal generated by the control module, and the first and second light signal frequencies measured by the self-referenced frequency comb.

2. The system of claim 1, further comprising a light conditioning module to condition the first light signal and the second light signal before the first light signal and the second light signal are oriented to interact with the atomic absorber.

3. The system of claim 2, wherein the light conditioning module applies FM modulation to the second light signal prior to delivery to the atomic absorber in the spectroscopy module.

4. The system of claim 3, wherein the light conditioning module applies the same AM modulation to both light signals prior to delivery to the atomic absorber in the spectroscopy module.

5. The system of claim 1, wherein the atomic absorber includes rubidium.

6. The system of claim 1, wherein the control module uses an induced modulation of the first light signal after the atomic absorber in response to FM modulation of the second light signal to generate the first feedback signal, which is used to adjust the frequency of the first or the second light signal and stabilize the sum of the two frequencies to the atomic absorber resonance frequency, and wherein the control module uses an induced modulation of the first feedback signal in response to AM modulation of both light signals to generate the second feedback signal, which is used to adjust the power of the first light signal or the second light signal and stabilize a ratio of the intensities of the two light signals to the zero ac Stark shift value.

7. The system of claim 1, wherein the first light source and the second light source are lasers that are collimated, linearly polarized, and overlapped to propagate in the opposite directions with orthogonal polarizations through the atomic absorber.

8. The system of claim 1, wherein the photodetector provides an indication of how well the sum of the first frequency and the second frequency are tuned to the atomic absorber resonance frequency.

9. The system of claim 1, wherein the control module is further configured to generate the second feedback signal further based on the response of the first feedback signal to the same-frequency modulated amplitudes of the first and second light signals.

10. The system of claim 1, wherein the amplitudes of the first and second light signals are modulated before the first and second light signals interact with the atomic absorber.

11. A method of providing a frequency reference signal, the method comprising:
generating a first light signal at a first frequency and a second light signal at a second frequency different from the first frequency,
wherein the sum of the first frequency and the second frequency is approximately equal to an atomic resonance frequency of an atomic absorber;
orienting the first light signal and the second light signal such that they interact with the atomic absorber;
generating a first feedback signal based on the light power of the first light signal after the atomic absorber based on a response of the first light signal after the atomic absorber to FM modulation of the second light signal;
generating a second feedback signal based on the response of the first feedback signal to an AM modulation of the first light signal and the second light signal;
stabilizing the sum of the frequencies of the first light signal and the second light signal to the atomic resonance frequency of the atomic absorber by adjusting the frequency of either the first light signal or the second light signal based on the first feedback signal;
stabilizing an intensity ratio of the first light signal and the second light signal in the atomic absorber to a zero light shift value by adjusting the power of either light signals based on the second feedback signal; and
stabilizing a repetition rate of a frequency comb to the atomic resonance frequency of the atomic absorber based upon the first feedback signal and the frequencies of the first light signal and second light signal measured by the frequency comb.

12. The method of claim 11, further comprising stabilizing the first light frequency to a component of a self-referenced frequency comb.

13. The method of claim 11, further comprising spatially superimposing the first light signal and the second light signal and applying the same spatial profile to the first light signal and the second light signal.

14. The method of claim 11, further comprising stabilizing a component of the frequency comb to the second light frequency.

15. The method of claim 11, further comprising adjusting the power of either the first light signal or the second light signal.

16. The method of claim 11, wherein the atomic absorber includes rubidium.

17. The method of claim 11, further comprising detecting, using a photodetector, transmitted light of the first light signal, wherein the first light signal has a minimum when the sum of the first frequency and the second frequency matches the frequency of the atomic resonance frequency of the atomic absorber.

18. An atomic clock with active ac stark shift cancellation, the atomic clock comprising:
a spectroscopy module having an atomic absorber having an atomic resonance frequency and a photodetector;
a light source and control module to generate, using one or more lasers, a first light signal at a first frequency and a second light signal at a second frequency different from the first frequency,
wherein a feedback signal is generated based on a signal corresponding to power of the first light signal after the atomic absorber as generated by the photodetector in the spectroscopy module,
wherein the signal has minimum when the sum of the first frequency of the first light signal and the second frequency of the second light signal match the atomic resonance frequency of the atomic absorber;
wherein the one or more lasers are collimated, linearly polarized, and overlapped to propagate in the opposite direction with orthogonal polarizations; and
a frequency comb having a repetition rate stabilized by the atomic absorber resonance frequency based upon the light signals and the feedback signal generated by the light source and control module.

19. The atomic clock of claim 18, wherein the light source and control module includes a light conditioning module to condition the first light signal and the second light signal before the first light signal and the second light signal are oriented to interact with the atomic absorber.

20. The atomic clock of claim 19, wherein the light conditioning module applies FM modulation to the second light signal prior to delivery to the atomic absorber in the spectroscopy module, and wherein light source and control module applies AM modulation to the first and the second light signals prior to delivery to the atomic absorber in the spectroscopy module.

21. The atomic clock of claim 19, wherein the light source and control module uses induced modulation of the first feedback signal in response to an AM modulation of first light signal and the second light signal to generate a second feedback signal, which is used to adjust the power of the first light signal or the second light signal.

22. The atomic clock of claim 18, wherein the atomic absorber includes rubidium.

\* \* \* \* \*